US006912149B2

(12) United States Patent
Yamaoka et al.

(10) Patent No.: US 6,912,149 B2
(45) Date of Patent: Jun. 28, 2005

(54) FERROELECTRIC MEMORY DEVICE AND METHOD FOR READING DATA FROM THE SAME

(75) Inventors: Kunisato Yamaoka, Osaka (JP); Hiroshige Hirano, Nara (JP); Yasuo Murakuki, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/620,614

(22) Filed: Jul. 17, 2003

(65) Prior Publication Data

US 2004/0017704 A1 Jan. 29, 2004

(30) Foreign Application Priority Data

Jul. 18, 2002 (JP) ........................................ 2002-209580

(51) Int. Cl.[7] .............................................. G11C 11/22
(52) U.S. Cl. .................................. 365/145; 365/189.07
(58) Field of Search ............................ 365/149, 189.07, 365/205

(56) References Cited

U.S. PATENT DOCUMENTS

| 5,572,459 | A |  | 11/1996 | Wilson et al. |
| 5,671,174 | A | * | 9/1997 | Koike et al. ................. 365/145 |
| 6,023,438 | A | * | 2/2000 | Tanaka et al. ............... 365/210 |
| 6,028,782 | A | * | 2/2000 | Hirano et al. ................ 365/145 |
| 6,055,200 | A | * | 4/2000 | Choi et al. .................. 365/201 |

FOREIGN PATENT DOCUMENTS

| JP | 07-262768 | 10/1995 |
| WO | WO 97/36300 | 10/1997 |

OTHER PUBLICATIONS

Yeonbae chung et al., "A 3.3–V 4–Mb Nonvolatile Ferroelectric RAM with Selectively–Driven Double–Pulsed Plate Read/Write–Back Scheme," Symposium on VLSI Circuits Digest of Technical Papers, pp. 97–97, 1999.

* cited by examiner

Primary Examiner—Hoai Ho
(74) Attorney, Agent, or Firm—McDermott Will & Emery LLP

(57) ABSTRACT

A ferroelectric memory device includes a plurality of bit line pairs, a plurality of sense amplifiers, a plurality of memory cells, a plurality of reference cells, and a control circuit. Each of the bit line pairs is composed of first and second bit lines. Each of the sense amplifiers amplifies a potential difference across the corresponding bit line pair. The memory cells are provided for the respective bit line pairs and each composed of a transistor and a ferroelectric capacitor. The reference cells are provided for the respective bit line pairs and each composed of a transistor and a ferroelectric capacitor. In addition, each of the reference cells on each of the bit line pairs retains data different from data of a reference cell on the adjacent bit line pair. The control circuit drives the sense amplifiers, the memory cells, and the reference cells. During the drive of the sense amplifier, the control circuit inactivates a reference word line connected to the reference cell.

5 Claims, 11 Drawing Sheets

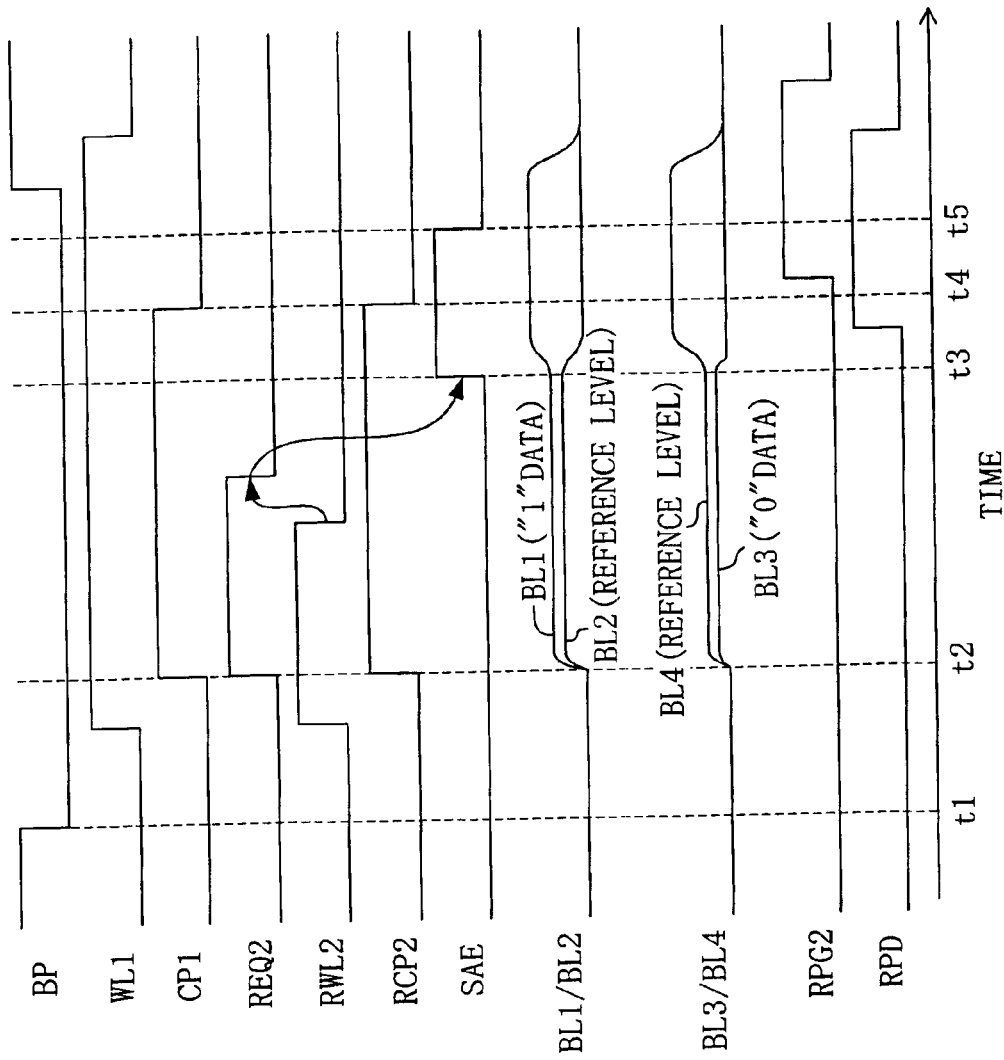

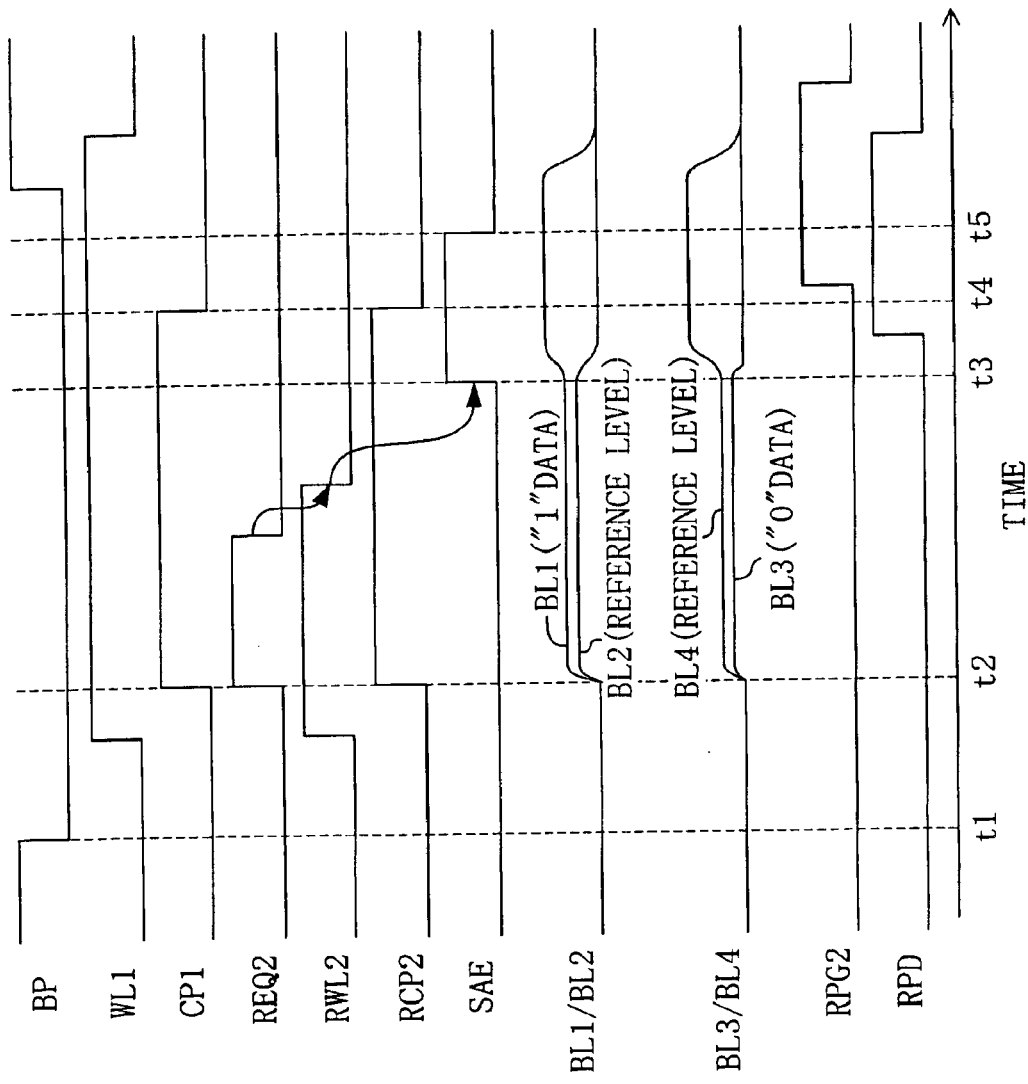

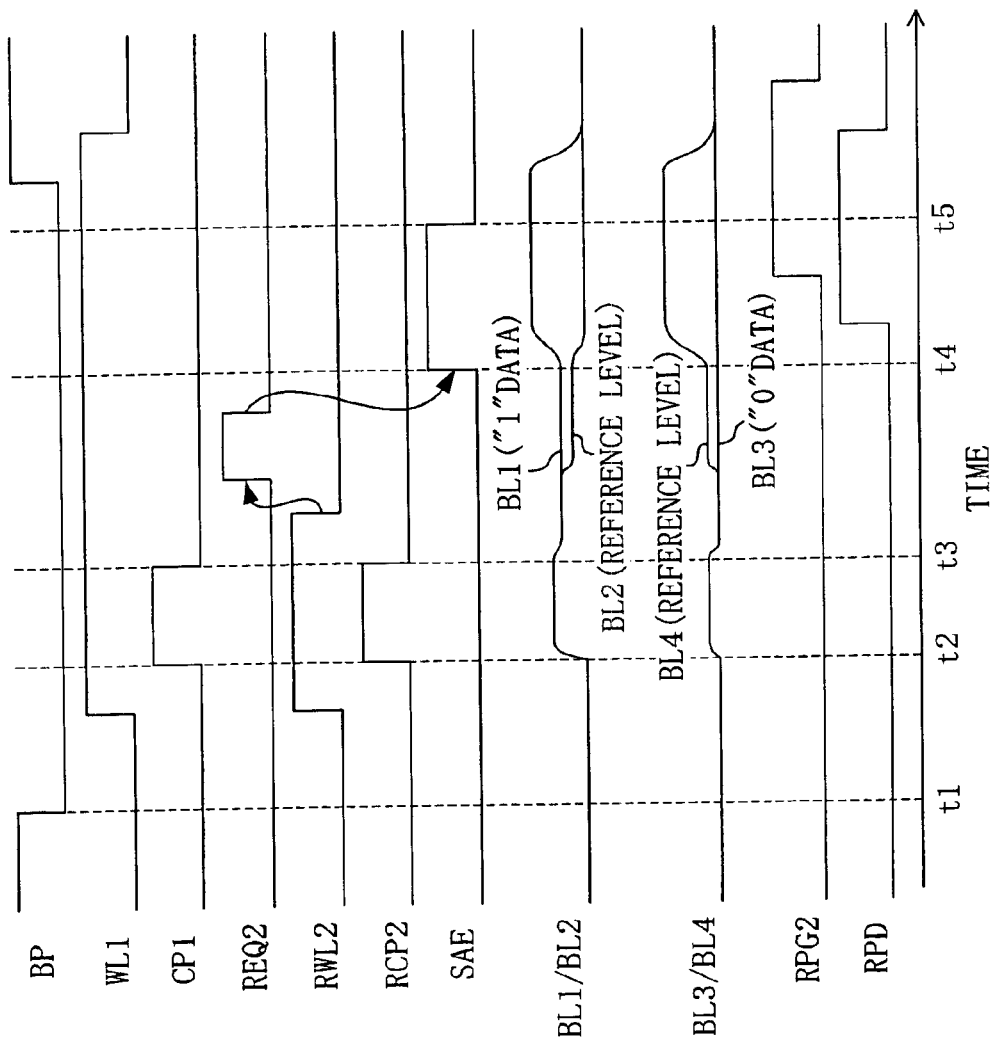

PRIOR ART FIG. 9
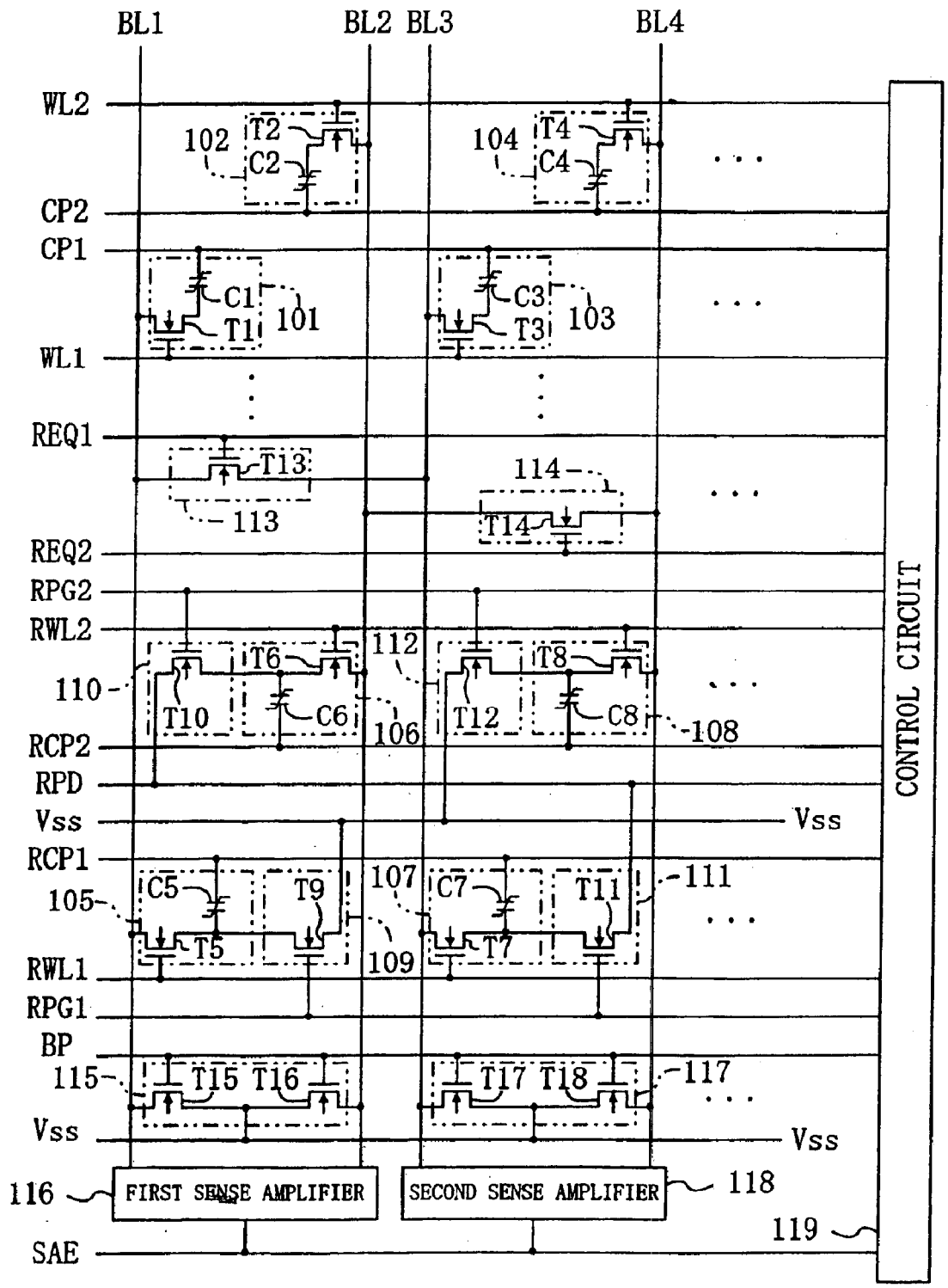

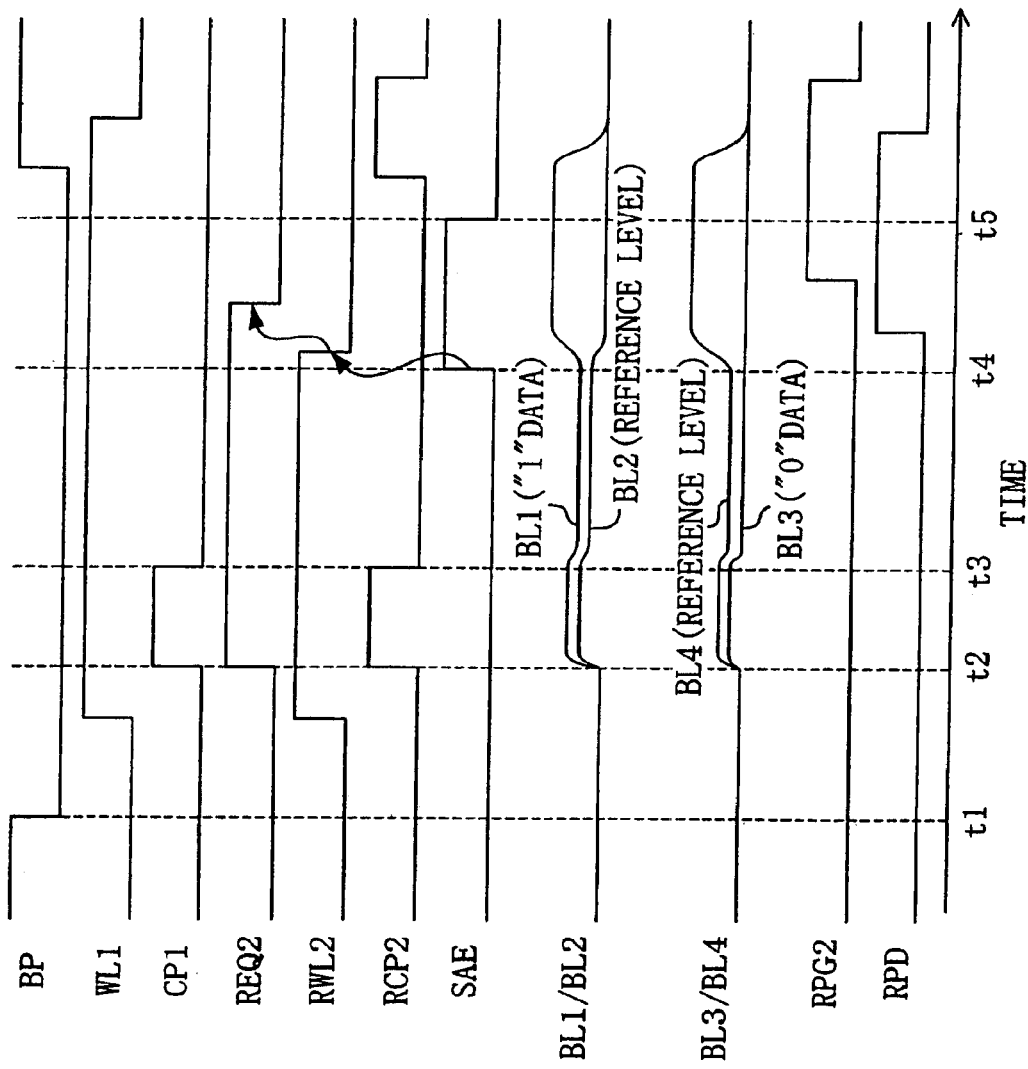

PRIOR ART FIG. 11
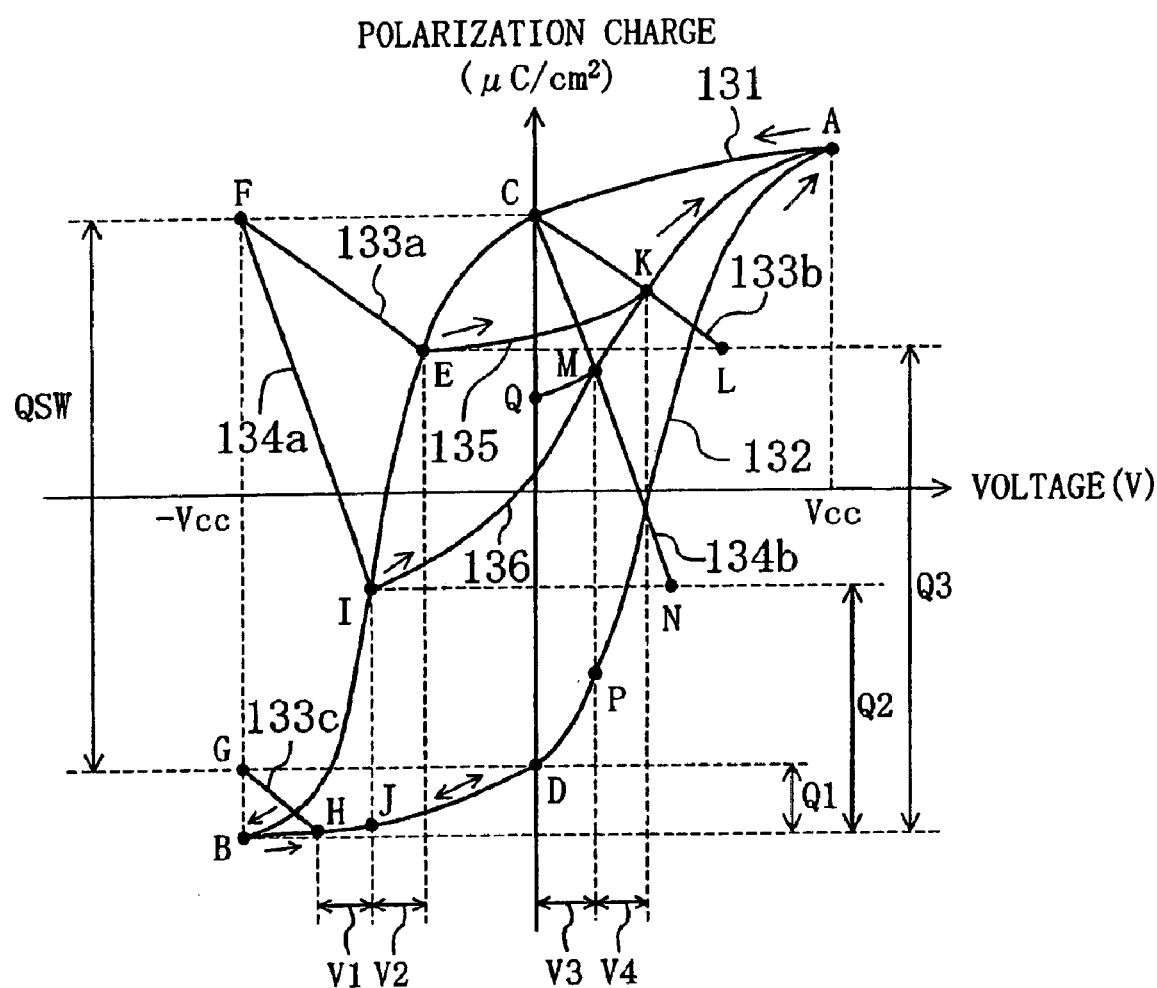

FERROELECTRIC MEMORY DEVICE AND METHOD FOR READING DATA FROM THE SAME

BACKGROUND OF THE INVENTION

The present invention relates to ferroelectric memory devices using ferroelectric capacitors in memory cells thereof and to methods for reading data from the same. More specifically, the present invention relates to a ferroelectric memory device in which a reference potential is generated by two reference cells retaining different data, and to a method for reading data from the same.

Recently, developments of ferroelectric memory devices have been proceeding. The ferroelectric memory device uses as memory elements ferroelectric capacitors having capacitor insulating films of ferroelectric, and retains data by utilizing remnant polarization held in the ferroelectric. Heretofore, the ferroelectric memory device has generally employed as a memory cell a two-transistor, two-capacitor memory cell which retains complementary data in two ferroelectric capacitors by using two transistors. Because of a recent demand for an increased data capacity and a recent trend toward a miniaturized process technology, the ferroelectric memory device has alternatively applied a one-transistor, one-capacitor memory cell.

The one-transistor, one-capacitor memory cell is provided with one bit line pair for reading data. Of the bit line pair connected to the memory cell, one bit line is supplied with a reference potential (reference level) and the other bit line is supplied with a potential according to remnant polarization. The potential difference across the two bit lines is then amplified by a sense amplifier, whereby data reading for the memory cell is performed. For example, Japanese Unexamined Patent Publication No.7-262768 discloses an exemplary one-capacitor, one-transistor memory cell of this type in which a reference potential is generated by two reference cells retaining different data.

A conventional ferroelectric memory device employing the one-transistor, one-capacitor memory cells will be described below with reference to the accompanying drawings.

FIG. 9 shows a circuit configuration of the conventional ferroelectric memory device. Referring to FIG. 9, the conventional ferroelectric memory device includes, as memory cells for retaining data, first to fourth memory cells 101 to 104 composed of transistors T1 to T4 and ferroelectric capacitors C1 to C4, respectively.

In the transistors T1 to T4, gates are each connected to either of word lines WL1 and WL2, and drains are connected to bit lines BL1 to BL4, respectively. In the ferroelectric capacitors C1 to C4, first electrodes are connected to sources of the transistors T1 to T4, respectively, and second electrodes are each connected to either of cell plate lines CP1 and CP2.

The conventional ferroelectric memory device further includes, as memory cells for retaining data used in the generation of a reference potential, first to fourth reference cells 105 to 108 composed of transistors T5 to T8 and ferroelectric capacitors C5 to C8, respectively.

In the transistors T5 to T8, gates are each connected to either of reference word lines RWL1 and RWL2, and drains are connected to the bit lines BL1 to BL4, respectively. In the ferroelectric capacitors C5 to C8, first electrodes are connected to sources of the transistors T5 to T8, respectively, and second electrodes are each connected to either of reference cell plate lines RCP1 and RCP2.

The first to fourth reference cells 105 to 108 are provided with first to fourth reset circuits 109 to 112, respectively, as circuits for writing predetermined pieces of data in the respective cells. The first to fourth reset circuits 109 to 112 are composed of transistors T9 to T12 whose drains are connected to the first electrodes of the ferroelectric capacitors C5 to C8, respectively.

The first and third bit lines BL1 and BL3 are connected to each other through a first switch circuit 113 composed of a transistor T13. The second and fourth bit lines BL2 and BL4 are connected to each other through a second switch circuit 114 composed of a transistor T14.

The first and second bit lines BL1 and BL2 are both connected to a first precharge circuit 115 composed of two transistors T15 and T16, and also connected to a first sense amplifier 116. The first and second bit lines BL1 and BL2 serve as a bit line pair for the first sense amplifier 116. Likewise, the third and fourth bit lines BL3 and BL4 are both connected to a second precharge circuit 117 composed of two transistors T17 and T18, and also connected to a second sense amplifier 118. The third and fourth bit lines BL3 and BL4 serve as a bit line pair for the second sense amplifier 118.

The ferroelectric memory device further includes a control circuit 119 for controlling the circuits described above. To be more specific, the control circuit 119 drives the first word line WL1, the second word line WL2, the first cell plate line CP1, the second cell plate line CP2, the first reference word line RWL1, the second reference word line RWL2, the first reference cell plate line RCP1, and the second reference cell plate line RCP2. Further, the control circuit 119 controls actions performed by each memory cell and each reference cell.

The control circuit 119 controls the first and third reset circuits 109 and 111 with a first reset control signal RPG1, the second and fourth reset circuits 110 and 112 with a second reset control signal RPG2, the first switch circuit 113 with a first switch control signal REQ1, the second switch circuit 114 with a second switch control signal REQ2, the first and second precharge circuits 115 and 117 with a precharge signal BP, and the first and second sense amplifiers 116 and 118 with a sense amplifier driving signal SAE.

The read operation in the conventional ferroelectric memory device will be described below with reference to the accompanying drawing. The following description using FIG. 10 is about the case where data is read out of the first and third memory cells 101 and 103, provided that the first and third memory cells 101 and 103 retain "1" data and "0" data, respectively, and the second and fourth reference cells 106 and 108 retain "1" data and "0" data, respectively.

Note that the memory cells and the reference cells retain "1" data when the ferroelectric capacitors C1 to C8 thereof have remnant polarization with their first electrodes being positive electrodes, and that they retain "0" data when the ferroelectric capacitors C1 to C8 thereof have remnant polarization with their second electrodes being positive electrodes.

FIG. 10 shows timings of the read operation in the conventional ferroelectric memory device. As shown in FIG. 10, first, in the initial state of the reading operation in this device, the bit line precharge signal BP is activated (a logical voltage of "H" level). The activated signal drives the first and second precharge circuits 115 and 117 to precharge the corresponding bit lines (specifically, the first, second, third and fourth bit lines BL1, BL2, BL3 and BL4) at the ground voltage Vss. In this state, the first word line WL1, the first cell plate line CP1, the second reference word line RWL2, the second reference cell plate line RCP2, the second switch control signal REQ2, the second reset control signal RPG2, the reset data signal RPD, and the sense amplifier driving signal SAE stay inactivated (a logical voltage of "L" level).

Next, the bit line precharge signal BP is inactivated at the timing of time t1, whereby the bit lines BL1 to BL4 are made floating.

Then, at the timing of time t2, the second switch control signal REQ2, the first word line WL1, the first cell plate line CP1, the second reference word line RWL2, and the second reference cell plate line RCP2 are activated.

In response, the transistors T1 and T3 are turned on and a voltage of "H" level is applied to the second electrodes of the ferroelectric capacitors C1 and C3. Then, "1" data retained in the first memory cell 101 is supplied to the first bit line BL1 and "0" data retained in the third memory cell 103 is supplied to the third bit line BL3. In addition, the transistors T6 and T8 are turned on and a voltage of "H" level is applied to the second electrodes of the ferroelectric capacitors C6 and C8. Then, "1" data retained in the second reference cell 106 is supplied to the second bit line BL2 and "0" data retained in the fourth reference cell 108 is supplied to the fourth bit line BL4.

At this timing, the activated second switch control signal REQ2 drives the second switch circuit 114 to equalize the second and fourth bit lines BL2 and BL4. As a result, the second and fourth bit lines BL2 and BL4 are supplied with an intermediate potential between the potential corresponding to "1" data and the potential corresponding to "0" data, which serves as a reference potential (reference level).

Next, at the timing of time t3, the first cell plate line CP1 and the second reference cell plate line RCP2 are inactivated.

Then, at the timing of time t4, the sense amplifier driving signal SAE is activated to drive the first and second sense amplifiers 116 and 118. In response, a potential difference across the first and second bit lines BL1 and BL2 is amplified so that the voltage value of the first bit line BL1 is equal to the source voltage Vcc and the voltage value of the second bit line BL2 is equal to the ground voltage Vss. Simultaneously, a potential difference across the third and fourth bit lines BL3 and BL4 is amplified so that the voltage value of the third bit line BL3 is equal to the ground voltage Vss and the voltage value of the fourth bit line BL4 is equal to the source voltage Vcc.

At this timing, the first word line WL1 stays activated, so that the source voltage Vcc and the ground voltage Vss are supplied to the first electrodes of the ferroelectric capacitors C1 and C3 through the transistors T1 and T3, respectively. Thus, rewriting in the first and third memory cells 101 and 103 is performed.

Subsequently to this series of actions, the second reference word line RWL2 and the second switch control signal REQ2 are successively inactivated. In response, the transistors T6 and T8 are turned off to separate the second and fourth reference cells 106 and 108 from the second and fourth bit lines BL2 and BL4, respectively, after which the second switch circuit 114 is stopped to separate the second bit line BL2 from the fourth bit line BL4.

Next, the reset data signal RPD and the second reset control signal RPG2 are successively activated, thereby performing rewriting in the second and fourth reference cells 106 and 108 by using the second and fourth reset circuits 110 and 112. In this rewriting, the first electrode of the ferroelectric capacitor C8 of the fourth reference cell 108 is supplied with the ground voltage Vss, so that "0" data is written in the fourth reference cell 108. On the other hand, the first electrode of the ferroelectric capacitor C6 of the second reference cell 106 is supplied with a voltage of "H" level serving as the reset data signal RPD, so that "1" data is written in the second reference cell 106.

Next, at the timing of time t5, the sense amplifier driving signal SAE is inactivated to stop the drive of the first and second sense amplifiers 116 and 118, after which the second reference cell plate line RCP2 is activated. In response, of the electrodes of the ferroelectric capacitor C6 of the second reference cell 106, the first electrode is supplied with a voltage of "H" level derived from the reset data signal RPD, and the second electrode is supplied with a voltage of "H" level derived from the second reference cell plate line RCP2. Therefore, the voltage applied to the ferroelectric capacitor C8 of the fourth reference cell 108 becomes zero volts.

Thereafter, the bit line precharge signal BP is activated and in addition the second reference cell plate line RCP2, the first word line WL1, the reset data signal RPD, and the second reset control signal RPG2 are successively inactivated to restore the device condition to the initial state. The read operation of the device is thus completed.

Next description using the drawings will be made of changes in charges stored in the ferroelectric capacitors during the read operation in the conventional ferroelectric memory device.

FIG. 11 is a graph showing the hysteresis properties of ferroelectric used in the ferroelectric capacitors of the conventional ferroelectric memory device. FIG. 11 plots the voltage applied to the electrodes of each ferroelectric capacitor in abscissa and the polarization charge thereof in ordinate. In FIG. 11, a positive polarization charge represents the amount of the polarization charge in the case where the first electrodes of the ferroelectric capacitors C1 to C8 are used as positive electrodes.

As shown in FIG. 11, when the source voltage Vcc in the positive direction is applied to a ferroelectric capacitor, the capacitor stores a polarization charge corresponding to a point A. When the applied voltage is changed from this state in the negative direction, the ferroelectric capacitor stores a polarization charge corresponding to a point to which the point A moves along a curve 131 in the negative direction. In contrast, when the source voltage Vcc in the negative direction is applied to the ferroelectric capacitor, the capacitor stores a polarization charge corresponding to a point B. When the applied voltage is changed from this state in the positive direction, the ferroelectric capacitor stores a polarization charge corresponding to a point to which the point B moves along a curve 132 in the positive direction.

The following description using FIG. 11 is about changes (the movement on FIG. 11) in polarization conditions of the ferroelectric capacitors in accordance with the timings of the read operation shown in FIG. 10.

Note that "L" level in FIG. 10 is set at the ground potential value Vss (0 V) and "H" level in FIG. 10 is set at the source voltage value Vcc.

First, at the timing of the time t0 in FIG. 10, no voltage is applied to the ferroelectric capacitors C1 to C8 of the memory cells and the reference cells. Therefore, in the first memory cell 101 and the second reference cell 106 both of which retain "1" data, the polarization charges of the ferroelectric capacitors C1 and C6 are located at a point C in FIG. 11. In the third memory cell 103 and the fourth reference cell 108 both of which retain "0" data, the polarization charges of the ferroelectric capacitors C3 and C8 are located at a point D in FIG. 11.

At the timing of the time t2 in FIG. 10, the transistors T1 and T3 are turned on and the source voltage Vcc is applied to the first cell plate line CP1. Then t2, the ground voltage Vss is applied to the first electrodes of the ferroelectric capacitors C1 and C3 and the source voltage Vcc is applied to the second electrodes of the ferroelectric capacitors C1 and C3. Likewise, the transistors T6 and T8 are turned on and the source voltage Vcc as a voltage of "H" level is applied to the second reference cell plate line RCP2. Then the ground voltage Vss is applied to the first electrodes of the ferroelectric capacitors C6 and C8 and the source voltage Vcc is applied to the second electrodes of the ferroelectric capacitors C6 and C8. Each of the ferroelectric capacitors C1, C3, C6 and C8 then changes in the condition from the state in which no voltage is applied to the state in which a negative voltage (−Vcc) is applied thereto.

At this timing, in the first memory cell 101, the polarization charge of the ferroelectric capacitor C1 moves from the point C to a point E along the curve 131. The point E is placed at the point determined by dividing the voltage Vcc applied to the ferroelectric capacitor C1 in accordance with the capacitance of the first bit line BL1 and the capacitance of the ferroelectric capacitor C1. To be more specific, the point to which the point C moves along the voltage axis in the negative direction by the voltage Vcc is defined as a point F, and a capacitance load line 133a of the first bit line BL1 is drawn from the point F. Thus, the point E is obtained as the intersection point of the capacitance load line 133a with the curve 131.

In the third memory cell 103, the polarization charge of the ferroelectric capacitor C3 moves from the point D along the curve 132 in the negative direction, and reaches to a point H which is located at the intersection point of the curve 132 with a capacitance load line 133c of the third bit line BL3 drawn from a point G to which the point D moves along the voltage axis in the negative direction by the voltage Vcc. Note that the capacitance of the third bit line BL3 is equal to that of the first bit line BL1, so that the capacitance load line 133c of the third bit line BL3 has the same inclination as the capacitance load line 133a of the first bit line BL1.

Likewise, in the second reference cell 106, the polarization charge of the ferroelectric capacitor C6 moves from the point C to a point I, and in the fourth reference cell 108, the polarization charge of the ferroelectric capacitor C8 moves from the point D to a point J. Herein, the point I is located at the intersection point of the curve 131 with a capacitance load line 134a of the second bit line BL2. The capacitance load line 134a has a greater inclination than the capacitance load lines 133a and 133c because the second and fourth bit lines are equalized to increase the capacitance value of the second bit line.

At this timing, a charge Q3 is read out on the first bit line BL1, and the first bit line BL1 has a potential of "1" data corresponding to the point E. Also, a charge Q2 is read out on the second and fourth bit lines BL2 and BL4, and the second and fourth bit lines BL2 and BL4 have reference potentials corresponding to the points I and J. Further, a charge Q1 is read out on the third bit line BL3, and the third bit line BL3 has a potential of "0" data corresponding to the point H. As a result, a potential difference V1 is created across the first and second bit lines BL1 and BL2, and a potential difference V2 is created across the third and fourth bit lines BL3 and BL4.

Next, at the timing of the time t3 in FIG. 10, the first cell plate line CP1 and the second reference cell plate line RCP2 are inactivated, so that in the first memory cell 101, the third memory cell 103, the second reference cell 106, and the fourth reference cell 108, the voltages applied to the respective ferroelectric capacitors change from the negative voltage (−Vcc) to zero volts.

By this change, in the first memory cell 101, the polarization charge of the ferroelectric capacitor C1 moves from the point E to a point K along a curve 135. The point K is located at the intersection point of the curve 135 with a capacitance load line 133b of the third bit line BL1 drawn from a point L to which the point E moves along the voltage axis in the positive direction by the voltage Vcc. In the third memory cell 103, the polarization charge of the ferroelectric capacitor C3 moves from the point H to the point D along the curve 132.

Likewise, in the second reference cell 106, the polarization charge of the ferroelectric capacitor C6 moves from the point I to a point M along a curve 136. The point M is located at the intersection point of the curve 136 with a capacitance load line 134b of the second bit line BL2 drawn from a point N to which the point I moves along the voltage axis in the positive direction by the voltage Vcc. In the fourth reference cell 108, the polarization charge of the ferroelectric capacitor C8 moves from the point H to a point P along the curve 132.

At that time, a potential difference V3 corresponding to the potential difference across the points K and P is created across the first and second bit lines BL1 and BL2, and a potential difference V4 corresponding to the potential difference across the points D and P is created across the third and fourth bit lines BL3 and BL4.

Next, at the timing of the time t4 in FIG. 10, the potential difference V4 is amplified by the first sense amplifier 116, whereby the first bit line BL1 has the source voltage Vcc and the second bit line BL2 has the ground voltage Vss. Since the transistors T1 and T6 are on in this state, the ferroelectric capacitor C1 of the first memory cell 101 has a positive voltage (Vcc) applied and the ferroelectric capacitor C6 of the second reference cell 106 has a voltage of zero volts. Therefore, in the first memory cell 101, the polarization charge of the ferroelectric capacitor C1 moves from the point K to the point A along the curve 135. In the second reference cell 106, the polarization charge of the ferroelectric capacitor C6 moves from the point M to a point Q.

Likewise, the potential difference V3 is amplified by the second sense amplifier 118, whereby the third bit line BL3 has the ground voltage Vss and the fourth bit line BL4 has the source voltage Vcc. Since the transistors T3 and T8 are on in this state, the ferroelectric capacitor C3 of the third memory cell 103 keeps a voltage of zero volts and the polarization charge thereof does not move and remains at the point D. In the fourth reference cell 108, the ferroelectric capacitor C8 thereof has the source voltage Vcc applied, so that the polarization charge thereof moves from the point P to the point A.

Subsequently, the reset data signal RPD and the second reset control signal RPG2 are successively activated. Then, the source voltage Vcc derived from the reset data signal RPD is applied to the first electrode of the ferroelectric capacitor C6 of the second reference cell 106, and the ground voltage Vss is applied to the ferroelectric capacitor C8 of the fourth reference cell 108. Therefore, the voltage applied to the ferroelectric capacitor C6 is changed from zero volts to a positive voltage and the polarization charge thereof moves from the point Q to the point A along the curve 136. In the ferroelectric capacitor C8 of the fourth reference cell 108, the voltage applied to the ferroelectric capacitor C8 is changed from the source voltage Vcc to zero volts and the polarization charge thereof moves from the point A to the point C along the curve 131.

Next, the second reference cell plate line RCP2 is activated subsequently to the timing of the time t5 in FIG. 10, whereby the source voltage Vcc is applied to the second electrodes of the ferroelectric capacitors C6 and C8 of the second and fourth reference cells 106 and 108. The voltage applied to the ferroelectric capacitor C6 is then changed from a positive voltage to zero volts and the polarization charge thereof moves from the point A to the point C along the curve 131. On the other hand, the voltage applied to the ferroelectric capacitor C8 is then changed from zero volts to a negative voltage and the polarization charge thereof moves from the point C to the point B along the curve 131.

Thereafter, the reset data signal RPD and the second reset control signal RPG2 are successively inactivated, so that the voltages of the first electrodes of the ferroelectric capacitors C6 and C8 become zero volts. The second reference cell plate line RCP2 is inactivated, so that the voltages of the second electrodes of the ferroelectric capacitors C6 and C8 become zero volts. From these actions, the ferroelectric capacitor C6 of the second reference cell 106 keeps a voltage of zero volts and the polarization charge thereof remains at the point C. In the fourth reference cell 108, the voltage applied to the ferroelectric capacitor C8 is then changed from a negative voltage to zero volts and the polarization charge thereof moves from the point B to the point D along the curve 132.

As is apparent from the above, the read operation of the memory cells in the conventional ferroelectric memory device is accomplished so that in the memory cell retaining "1" data, the polarization charge of the ferroelectric capacitor thereof moves progressively in the order of the point C, the point E, the point K, the point A, and the point C, and that in the memory cell retaining "0" data, the polarization charge of the ferroelectric capacitor thereof moves progressively in the order of the point D, the point H, the point B, and the point D. The read operation of the reference cells is accomplished so that in the reference cell retaining "1" data, the polarization charge of the ferroelectric capacitor thereof moves progressively in the order of the point C, the point I, the point M, the point Q, the point A, and the point C, and that in the reference cell retaining "0" data, the polarization charge of the ferroelectric capacitor thereof moves progressively in the order of the point D, the point J, the point P, the point A, the point B, and the point D. In this read operation, the amount of charge for polarization reversal in the ferroelectric capacitor retaining "0" data is equal to the charge amount QSW between the point C and the point D shown in FIG. 11.

The conventional ferroelectric memory device described above, however, has a problem relating to the properties of the number of rewriting operations. In a number of memory cells provided on a single bit line pair, every time one memory cell is read out, one reference cell pair operates for the reading. This greatly increases the number of times each reference cell operates as compared with the number of times each memory cell operates. As a result, the properties of the number of rewriting operations in the ferroelectric memory device decrease depending upon the degradation of the reference cells.

SUMMARY OF THE INVENTION

An object of the present invention is to solve the foregoing problem, and to provide a ferroelectric memory device generating a reference potential with reference cells and having enhanced properties of the number of rewriting operations by decreasing the amount of charge for polarization reversal in the reference cells during the read operation of the device.

To attain this object, a ferroelectric memory device of the present invention comprises: a plurality of bit line pairs each of which is composed of first and second bit lines; a plurality of sense amplifiers each for amplifying a potential difference across the corresponding bit line pair; a plurality of memory cells provided for the bit line pairs, respectively, each of the memory cells being composed of a first ferroelectric capacitor for retaining data and a transistor whose source is connected to a first electrode of the first ferroelectric capacitor and whose drain is connected to the first bit line; a plurality of reference cells provided for the bit line pairs, respectively, each of the reference cells being composed of a second ferroelectric capacitor for retaining data and a transistor whose source is connected to a first electrode of the second ferroelectric capacitor and whose drain is connected to the second bit line; a word line connecting gates of the transistors of the memory cells; a reference word line connecting gates of the transistors of the reference cells; a cell plate line connecting second electrodes of the ferroelectric capacitors of the memory cells; a reference cell plate line connecting second electrodes of the ferroelectric capacitors of the reference cells; and a control circuit for controlling operations of the memory cells, the reference cells, and the sense amplifiers. In the ferroelectric memory device, the control circuit inactivates the reference word line during the drive of the sense amplifiers.

In the ferroelectric memory device of the present invention, the first electrode of the ferroelectric capacitor in the reference cell is separated from the second bit line during the drive of the sense amplifier, which prevents the polarization charge of the ferroelectric capacitor in the reference cell from moving due to the potential amplified by the sense amplifier. This decreases the amount of charge for polarization reversal in the reference cell, resulting in the reduction of stresses occurring in the ferroelectric capacitor of the reference cell during the read operation of the memory cell. Consequently, the properties of the number of rewriting operations can be enhanced in the ferroelectric memory device.

Preferably, the ferroelectric memory device of the present invention further comprises a switch circuit connecting the second bit lines included in adjacent bit line pairs of the plurality of bit line pairs. In the ferroelectric memory device, the control circuit stops the drive of the switch circuit during the drive of the sense amplifiers.

With this configuration, the reference voltage for the sense amplifiers is generated by connecting two second bit lines, and the sense amplifiers are driven while the two bit lines are kept separated. This minimizes the power consumption of the ferroelectric memory device.

Preferably, in the ferroelectric memory device of the present invention, the control circuit performs successive actions of: driving the switch circuit and activating the word line, the cell plate line, the reference word line and the reference cell plate line; inactivating the cell plate line and the reference cell plate line; inactivating the reference word line; stopping the drive of the switch circuit; and driving the sense amplifiers.

With this sequence, the switch circuit is driven before the reference word line is activated, so that noises caused in stopping the drive of the switch circuit are not transferred to the ferroelectric capacitor. This prevents the polarization charge of the ferroelectric capacitor from moving due to the noises accompanied with the inactivation of the switch control signal. In particular, when the capacitances of the bit lines are large, the noises accompanied with the suspension of the switch circuit have a little effect on the potentials of the bit lines. This enables a reliable read operation in the ferroelectric memory device.

Preferably, in the ferroelectric memory device of the present invention, the control circuit performs successive actions of: driving the switch circuit and activating the word line, the cell plate line, the reference word line and the reference cell plate line; inactivating the cell plate line and the reference cell plate line; stopping the drive of the switch circuit; inactivating the reference word line; and driving the sense amplifiers.

With this sequence, the reference word line is inactivated after the drive of the switch circuit is stopped. Therefore, in the case of small capacitances of the bit lines, noises accompanied with the suspension of the switch circuit have a little effect on the bit lines, which enables a reliable read operation in the ferroelectric memory device.

Preferably, in the ferroelectric memory device of the present invention, the control circuit performs successive actions of: driving the switch circuit and activating the word line, the cell plate line, the reference word line and the reference cell plate line; inactivating the reference word line; stopping the drive of the switch circuit; inactivating the cell plate line and the reference cell plate line; and driving the sense amplifiers.

With this sequence, the cell plate line and the reference cell plate line are kept activated even during the drive of the sense amplifier, which raises the potential of the bit line in stopping the drive of the switch circuit. Therefore, it is possible to reduce the effect of noises on the ferroelectric memory device.

Preferably, in the ferroelectric memory device of the present invention, the control circuit performs successive actions of: driving the switch circuit and activating the word line, the cell plate line, the reference word line and the reference cell plate line; stopping the drive of the switch circuit; inactivating the reference word line; inactivating the cell plate line and the reference cell plate line; and driving the sense amplifiers.

Preferably, in the ferroelectric memory device of the present invention, the control circuit performs successive actions of: driving the switch circuit; and activating the word line, the cell plate line, the reference word line and the reference cell plate line.

With this sequence, the cell plate line and the reference cell plate line are activated with the driving time of the switch circuit secured, which reduces the time that elapsed before the potential used for reference is created. This makes it possible to operate the ferroelectric memory device with high speed.

Preferably, in the ferroelectric memory device of the present invention, the control circuit performs successive actions of: activating the reference word line and the reference cell plate line for a predetermined period of time; driving the switch circuit for a predetermined period of time; and driving the sense amplifiers.

With this sequence, the bit lines are equalized with the capacitance of the ferroelectric capacitor not added to the bit lines. This decreases the amount of charge for polarization reversal to a further extent, and in addition generates a reference potential accurately. This further enhances the properties of the number of rewriting operations and the reliability of the read operation of the ferroelectric memory device.

A method for reading data from a ferroelectric memory device of the present invention employs a ferroelectric memory device including: a plurality of bit line pairs each of which is composed of first and second bit lines; a plurality of sense amplifiers each for amplifying a potential difference across the corresponding bit line pair; a plurality of memory cells provided for the bit line pairs, respectively, each of the memory cells being composed of a first ferroelectric capacitor for retaining data and a transistor whose source is connected to a first electrode of the first ferroelectric capacitor and whose drain is connected to the first bit line; a plurality of reference cells provided for the bit line pairs, respectively, each of the reference cells being composed of a second ferroelectric capacitor for retaining data and a transistor whose source is connected to a first electrode of the second ferroelectric capacitor and whose drain is connected to the second bit line; a word line connecting gates of the transistors of the memory cells; a reference word line connecting gates of the transistors of the reference cells; a cell plate line connecting second electrodes of the ferroelectric capacitors of the memory cells; a reference cell plate line connecting second electrodes of the ferroelectric capacitors of the reference cells; a control circuit for controlling operations of the memory cells, the reference cells, and the sense amplifiers; and a switch circuit connecting the second bit lines included in adjacent bit line pairs of the plurality of bit line pairs. The method comprises: a first step of activating the word line and the reference word line; a second step of activating the cell plate line and the reference cell plate line for a predetermined period of time; a third step of activating a switch control signal for driving the switch circuit; a fourth step of inactivating the reference word line after the first step; a fifth step of inactivating the switch control signal after the third step; and a sixth step of driving the sense amplifier for a predetermined period of time after the fourth step.

In this method, the first electrode of the ferroelectric capacitor in the reference cell is separated from the second bit line during the drive of the sense amplifier, which prevents the polarization charge of the ferroelectric capacitor in the reference cell from moving due to the potential amplified by the sense amplifier. This decreases the amount of charge for polarization reversal in the reference cell, resulting in the reduction of stresses occurring in the ferroelectric capacitor of the reference cell during the read operation of the memory cell. Consequently, the properties of the number of rewriting operations can be enhanced in the ferroelectric memory device.

In the method for reading a ferroelectric memory device according to the present invention, the sixth step is preferably performed after the fifth step.

With this method, the sense amplifier is driven while the two bit lines supplied with different pieces of data are kept separated. This minimizes the power consumption of the ferroelectric memory device.

In the method for reading a ferroelectric memory device according to the present invention, the fifth step is preferably performed after the fourth step.

With this method, the switch control signal is inactivated after the reference word line is inactivated, so that noises caused in the inactivation of the switch control signal are not transferred to the ferroelectric capacitor. This prevents the polarization charge of the ferroelectric capacitor from moving due to the noises accompanied with the inactivation of the switch control signal. In particular, when the capacitances of the bit lines are large, the noises accompanied with the inactivation of the switch control signal have a little effect on the potentials of the bit lines. This enables a reliable read operation in the ferroelectric memory device.

In the method for reading a ferroelectric memory device according to the present invention, the fifth step is preferably performed before the fourth step.

With this method, the reference word line is inactivated after the inactivation of the switch control signal. Therefore, in the case of small capacitances of the bit lines, noises accompanied with the inactivation of the switch control signal have a little effect on the bit lines, which enables a reliable read operation in the ferroelectric memory device.

In the method for reading a ferroelectric memory device according to the present invention, the second step is preferably kept on until after the initiation of the sixth step.

With this method, the cell plate line and the reference cell plate line are kept activated even during the drive of the sense amplifier, which raises the potential of the bit line in the inactivation of the switch control signal.

In the method for reading a ferroelectric memory device according to the present invention, the first step is preferably performed after the third step.

With this method, the cell plate line and the reference cell plate line are activated with the equalization time secured by the activation of the switch control signal, which reduces the time that elapsed before the potential of the bit line becomes a reference potential. This makes it possible to operate the ferroelectric memory device with high speed.

In the method for reading a ferroelectric memory device according to the present invention, the third step is preferably performed after the fourth step.

With this method, the bit lines are equalized with the capacitance of the ferroelectric capacitor not added to the bit lines, which decreases the amount of charge for polarization reversal to a further extent, and in addition generates a reference potential accurately. This further enhances the properties of the number of rewriting operations and the reliability of the read operation of the ferroelectric memory device.

BRIEF DESCRIPTION OF THE DRAWINGS

FIG. 6 is a timing chart showing timings of the read operation in a ferroelectric memory device according to a third embodiment of the present invention.

FIG. 7 is a timing chart showing timings of the read operation in a ferroelectric memory device according to a fourth embodiment of the present invention.

FIG. 8 is a timing chart showing timings of the read operation in a ferroelectric memory device according to a fifth embodiment of the present invention.

FIG. 9 is a circuit diagram showing a conventional ferroelectric memory device.

FIG. 10 is a timing chart showing timings of the read operation in the conventional ferroelectric memory device.

FIG. 11 is a graph showing the hysteresis properties of ferroelectric capacitors in the conventional ferroelectric memory device.

DETAILED DESCRIPTION OF THE PREFERRED EMBODIMENTS (First Embodiment)

A ferroelectric memory device according to a first embodiment of the present invention will now be described with reference to the accompanying drawings.

Figure 1:
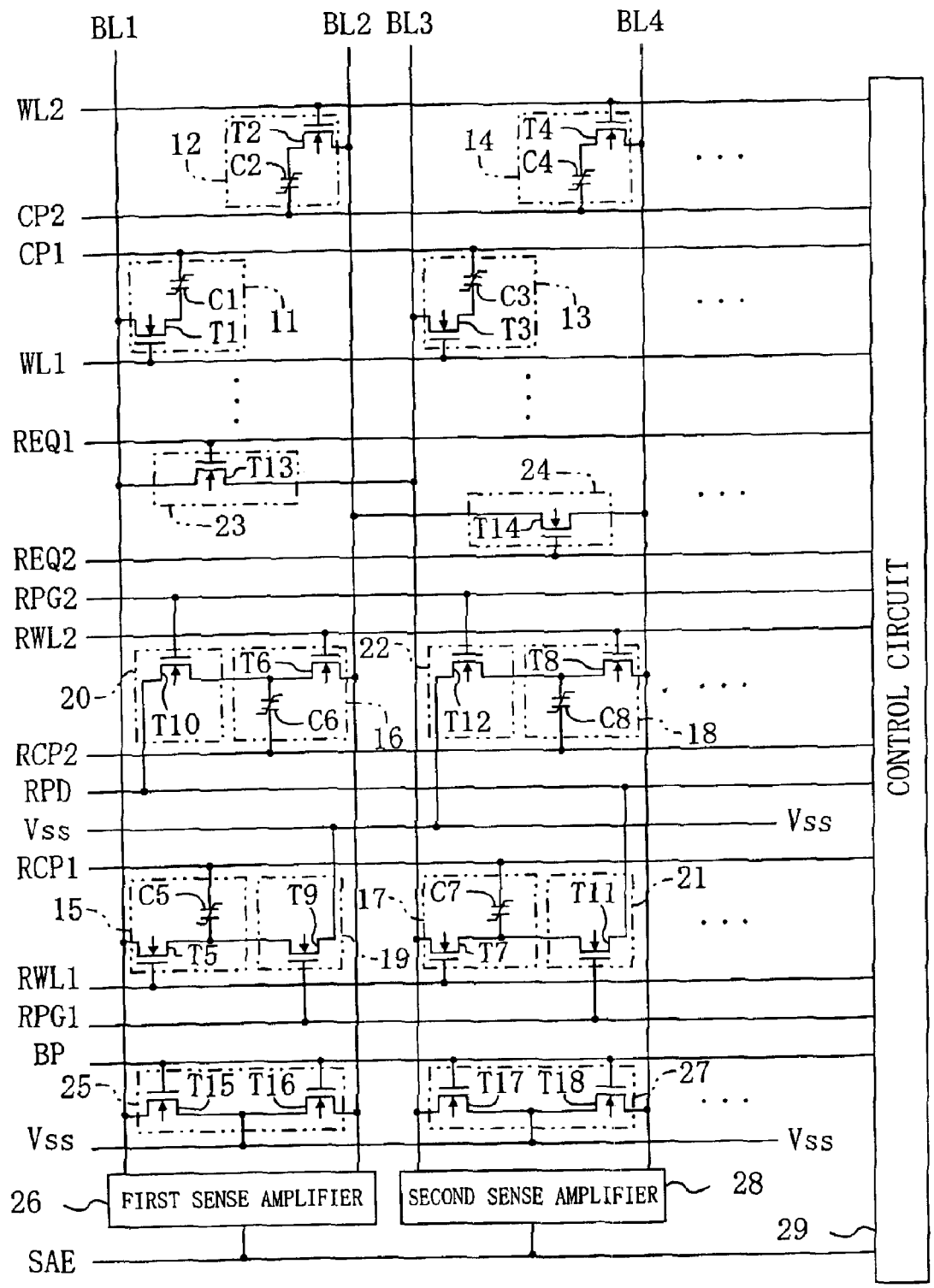
FIG. 1 is a circuit diagram showing a ferroelectric memory device according to a first embodiment of the present invention.

FIG. 1 shows a circuit configuration of the ferroelectric memory device according to the first embodiment. Referring to FIG. 1, the ferroelectric memory device of the first embodiment includes first, second, third and fourth memory cells 11, 12, 13 and 14 as memory cells for retaining data. The first memory cell 11 is composed of a transistor T1 whose gate is connected to a first word line WL1 and whose drain is connected to a first bit line BL1, and a ferroelectric capacitor C1 whose first electrode is connected to a source of the transistor T1 and whose second electrode is connected to a first cell plate line CP1. The second memory cell 12 is composed of a transistor T2 whose gate is connected to a second word line WL2 and whose drain is connected to a second bit line BL2, and a ferroelectric capacitor C2 whose first electrode is connected to a source of the transistor T2 and whose second electrode is connected to a second cell plate line CP2. The third memory cell 13 is composed of a transistor T3 whose gate is connected to the first word line WL1 and whose drain is connected to a third bit line BL3, and a ferroelectric capacitor C3 whose first electrode is connected to a source of the transistor T3 and whose second electrode is connected to the first cell plate line CP1. The fourth memory cell 14 is composed of a transistor T4 whose gate is connected to the second word line WL2 and whose drain is connected to a fourth bit line BL4, and a ferroelectric capacitor C4 whose first electrode is connected to a source of the transistor T4 and whose second electrode is connected to the second cell plate line CP2.

The ferroelectric memory device of the first embodiment further includes first, second, third and fourth reference cells 15, 16, 17 and 18 as memory cells for retaining data used in the generation of a reference potential (reference level). The first reference cell 15 is composed of a transistor T5 whose gate is connected to a first reference word line RWL1 and whose drain is connected to the first bit line BL1, and a ferroelectric capacitor C5 whose first electrode is connected to a source of the transistor T5 and whose second electrode is connected to a first reference cell plate line RCP1. The second reference cell 16 is composed of a transistor T6 whose gate is connected to a second reference word line RWL2 and whose drain is connected to the second bit line BL2, and a ferroelectric capacitor C6 whose first electrode is connected to a source of the transistor T6 and whose second electrode is connected to a second reference cell plate line RCP2. The third reference cell 17 is composed of a transistor T7 whose gate is connected to the first reference word line RWL1 and whose drain is connected to the third bit line BL3, and a ferroelectric capacitor C7 whose first electrode is connected to a source of the transistor T7 and whose second electrode is connected to the first reference cell plate line RCP1. The fourth reference cell 18 is composed of a transistor T8 whose gate is connected to the second reference word line RWL2 and whose drain is connected to the fourth bit line BL4, and a ferroelectric capacitor C8 whose first electrode is connected to a source of the transistor T8 and whose second electrode is connected to the second reference cell plate line RCP2.

The first to fourth reference cells 15 to 18 are provided with first to fourth reset circuits 19 to 22, respectively, as circuits for writing predetermined pieces of data in the respective cells. The first to fourth reset circuits 19 to 22 are composed of transistors T9 to T12 whose drains are connected to the first electrodes of the ferroelectric capacitors C5 to C8, respectively.

The first and third bit lines BL1 and BL3 are connected to each other through a first switch circuit 23 composed of a transistor T13. The second and fourth bit lines BL2 and BL4 are connected to each other through a second switch circuit 24 composed of a transistor T14.

The first and second bit lines BL1 and BL2 are both connected to a first precharge circuit 25 composed of two transistors T15 and T16, and also connected to a first sense amplifier 26. The first and second bit lines BL1 and BL2 serve as a bit line pair for the first sense amplifier 26. Likewise, the third and fourth bit lines BL3 and BL4 are both connected to a second precharge circuit 27 composed of two transistors T17 and T18, and also connected to a second sense amplifier 28. The third and fourth bit lines BL3 and BL4 serve as a bit line pair for the second sense amplifier 28.

The ferroelectric memory device further includes a control circuit 29 for controlling the circuits described above.

To be more specific, the control circuit 29 drives the first word line WL1, the first cell plate line CP1, the second word line WL2, the second cell plate line CP2, the first reference word line RWL1, the first reference cell plate line RCP1, the second reference word line RWL2, and the second reference cell plate line RCP2. Further, the control circuit 29 controls the output of data retained in each memory cell and each reference cell to the corresponding bit line.

The control circuit 29 supplies a first reset control signal RPG1 to the gates of the transistors T9 and T11 to drive the first and third reset circuits 19 and 21, respectively, and supplies a second reset control signal RPG2 to the gates of the transistors T10 and T12 to drive the second and fourth reset circuits 20 and 22, respectively. The control circuit 29 thus controls data rewriting in each reference cell.

In this control, for the first and fourth reset circuits 19 and 22, a reset data signal RPD is supplied to the sources of the transistors T9 and T12 thereof. For the second and third reset circuits 20 and 21, a ground voltage Vss is supplied to the sources of the transistors T10 and T11 thereof. Therefore, data written in the first and fourth reset circuits 19 and 22 are different from data written in the second and third reset circuits 20 and 21.

The control circuit 29 supplies a first switch control signal REQ1 to the gate of the transistor T13 to drive the first switch circuit 23, thereby bringing the first and third bit lines BL1 and BL3 into conduction. Likewise, the control circuit 29 supplies a second switch control signal REQ2 to the gate of the transistor T14 to drive the second switch circuit 24, thereby bringing the second and fourth bit lines BL2 and BL4 into conduction.

The control circuit 29 supplies a precharge signal BP to the gates of the transistors T15 to T18 to control the first and second precharge circuits 25 and 27, thereby precharging the first to fourth bit lines BL1 to BL4 at the ground voltage Vss.

The control circuit 29 activates a sense amplifier driving signal SAE to drive the first sense amplifier 26, thereby amplifying the potential difference across the bit line pair composed of the first and second bit lines BL1 and BL2. Likewise, the control circuit 29 activates the sense amplifier driving signal SAE to drive the second sense amplifier 28, thereby amplifying the potential difference across the bit line pair composed of the third and fourth bit lines BL3 and BL4.

The device configuration described above accomplishes the data reading in the first and third memory cells 11 and 13 in such a manner that the second and fourth bit lines BL2 and BL4 are equalized by the first switch circuit 23 to supply, to the second and fourth bit lines BL2 and BL4, an intermediate potential between the potential corresponding to the data retained by the second reference cell 16 and the potential corresponding to the data retained by the fourth reference cell 18, which serves as a reference potential.

Also, the device configuration described above accomplishes the data reading in the second and fourth memory cells 12 and 14 in such a manner that the first and third bit lines BL1 and BL3 are equalized by the second switch circuit 24 to supply, to the first and third bit lines BL1 and BL3, an intermediate potential between the potential corresponding to the data retained by the first reference cell 15 and the potential corresponding to the data retained by the third reference cell 17, which serves as a reference potential.

In the ferroelectric memory device of the first embodiment shown in FIG. 1, the bit lines BL1 to BL4 are each provided in plurality across the word lines, and the memory cells are each provided in plurality along the bit lines.

In this device, various circuits are formed between the bit line pair composed of the first and second bit lines BL1 and BL2 and between the bit line pair composed of the third and fourth bit lines BL3 and BL4. One said pair has the same circuit arrangement as the other said pair except that in the adjacent bit line pairs, the reset circuits for receiving the reset data signal RPD and the reset circuits for receiving the ground potential Vss are reversed in position. This enables the retention of different data in the reference cells provided on the two bit lines in the adjacent bit line pairs which are connected to each other by the switch circuit.

Note that for each of the bit line pairs composed of the first and second bit lines BL1 and BL2 and composed of the third and fourth bit lines BL3 and BL4 in the device of the first embodiment in FIG. 1, a memory cell and a reference cell are not necessarily formed on the both bit lines of each pair. The reference cell need only be formed on the bit line different from the bit line for reading data in the memory cell.

For example, in the bit line pair composed of the first and second bit lines BL1 and BL2, the second memory cell 12 and the first reference cell 15 may be absent. In this case, the second switch circuit 24 enables equalization of the second reference cell 16 with the fourth reference cell 18 which is a reference cell on the adjacent bit line pair, thereby supplying a reference potential to the second bit line BL2.

In the ferroelectric memory device of the first embodiment shown in FIG. 1, the first reference cell 15 and the fourth reference cell 18 are connected to the ground potential line Vss through the first reset circuit 19 and the fourth reset circuit 22, respectively, and the second reference cell 16 and the third reference cell 17 are connected to the reset data signal line RPD through the second reset circuit 20 and the third reset circuit 21, respectively. However, the device configuration is not limited to this. Alternatively, reference cells provided on two bit lines connected to each other through a switch circuit need only have different data written.

The read operation in the ferroelectric memory device according to the first embodiment will be described below with reference to the accompanying drawing. The following description employs an exemplary device configuration such that signals generated by the control circuit 29 use a positive source voltage Vcc for a logical voltage of "H" level and a ground voltage Vss of zero volts for a logical voltage of "L" level. Also in this configuration, the memory cells and the reference cells retain "1" data when the ferroelectric capacitors C1 to C8 thereof have remnant polarization with their first electrodes being positive electrodes, and they retain "0" data when the ferroelectric capacitors C1 to C8 thereof have remnant polarization with their second electrodes being positive electrodes.

The description that follows is about the read operation of the first and third memory cells 11 and 13 where the first and third memory cells 11 and 13 retain "1" data and "0" data, respectively, and the second and fourth reference cells 16 and 18 have "1" data and "0" data written in advance, respectively.

Figure 2:
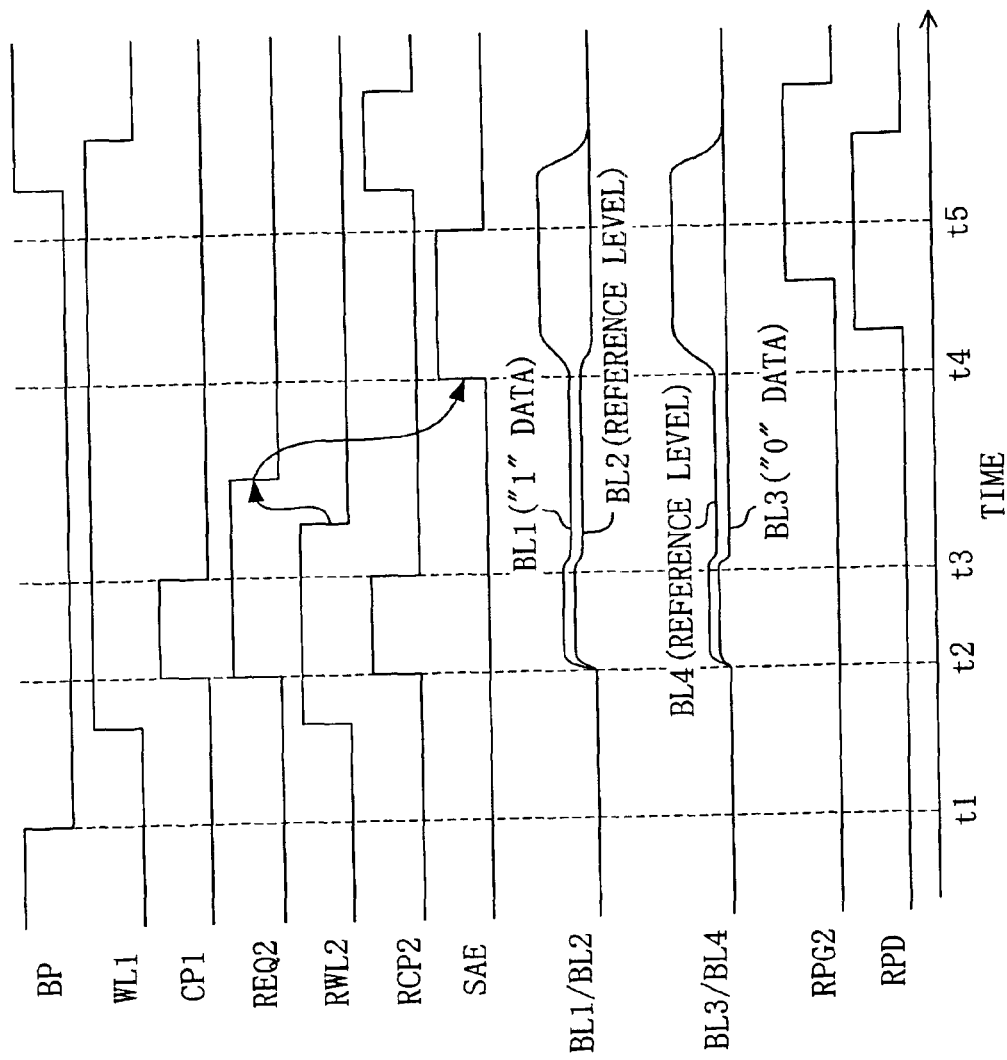
FIG. 2 is a timing chart showing timings of the read operation in the ferroelectric memory device according to the first embodiment of the present invention.

FIG. 2 shows timings of the read operation in the ferroelectric memory device of the first embodiment. As shown in FIG. 2, first, in the initial state of the reading operation in the ferroelectric memory device of the first embodiment, the bit line precharge signal BP is activated (a logical voltage of "H" level). The activated signal drives the first and second precharge circuits 25 and 27 to precharge the corresponding bit lines (specifically, the first, second, third and fourth bit lines BL1, BL2, BL3 and BL4) at the ground voltage Vss.

In this state, the first word line WL1, the first cell plate line CP1, the second reference word line RWL2, the second reference cell plate line RCP2, the second switch control signal REQ2, the second reset control signal RPG2, the reset data signal RPD, and the sense amplifier driving signal SAE stay inactivated (a logical voltage of "L" level).

Although not shown in this figure, no read operation of the second and fourth memory cells 12 and 14 is done during the read operation of the first and third memory cells 11 and 13. Therefore, the second word line WL2, the second cell plate line CP2, the first reference word line RWL1, the first reference cell plate line RCP1, the first switch control signal REQ1, and the first reset control signal RPG1 are kept inactivated.

Next, the bit line precharge signal BP is inactivated at the timing of time t1, whereby the bit lines BL1 to BL4 are made floating.

Then, at the timing of time t2, the second switch control signal REQ2, the first word line WL1, the first cell plate line CP1, the second reference word line RWL2, and the second reference cell plate line RCP2 are made activated.

In response, the transistors T1 and T3 are turned on and a voltage of "H" level used for data reading is applied to the second electrodes of the ferroelectric capacitors C1 and C3. Then, a potential corresponding to "1" data retained in the first memory cell 11 is supplied to the first bit line BL1 and a potential corresponding to "0" data retained in the third memory cell 13 is supplied to the third bit line BL3. The values of the potentials received by the bit lines are determined by dividing the voltages for the data reading applied to the second electrodes of the ferroelectric capacitors C1 and C3 in accordance with the capacitances of the bit lines and the capacitances of the ferroelectric capacitors C1 and C3, respectively. As a result, a voltage according to the data retained in each memory cell is supplied to the corresponding bit line.

Likewise, the transistors T6 and T8 are turned on and a voltage of "H" level is applied to the second electrodes of the ferroelectric capacitors C6 and C8. Then, "1" data retained in the second reference cell 16 is supplied to the second bit line BL2 and "0" data retained in the fourth reference cell 18 is supplied to the fourth bit line BL4.

At this timing, the activated second switch control signal REQ2 drives the second switch circuit 24, thereby equalizing the second and fourth bit lines BL2 and BL4. As a result, the second and fourth bit lines BL2 and BL4 are supplied with an intermediate potential between the potential corresponding to "1" data and the potential corresponding to "0" data, which serves as a reference potential.

Note that in FIG. 2, the first word line WL1 and the second reference word line RWL2 become activated before the time t2. Alternatively, the two lines may be activated concurrently with the first cell plate line CP1 and the second reference cell plate line RCP2.

Next, at the timing of time t3, the first cell plate line CP1 and the second reference cell plate line RCP2 are inactivated. This stops voltage supply to the second electrodes of the ferroelectric capacitors C1 and C3 and the second electrodes of the ferroelectric capacitors C6 and C8, which stops data output from the first and third memory cells 11 and 13 and the second and fourth reference cells 16 and 18 to the respective bit lines BL1 to BL4.

Subsequently to this action and prior to the timing of time t4, the second reference word line RWL2 and the second switch control signal REQ2 are successively inactivated. In response, the transistors T6 and T8 are turned off to separate the second and fourth reference cells 16 and 18 from the second and fourth bit lines BL2 and BL4, respectively, after which the second switch circuit 24 is stopped to separate the second bit line BL2 from the fourth bit line BL4.

Then, at the timing of time t4, the sense amplifier driving signal SAE is activated to drive the first and second sense amplifiers 26 and 28. In response, a potential difference across the first and second bit lines BL1 and BL2 is amplified so that the voltage value of the first bit line BL1 is equal to the source voltage Vcc and the voltage value of the second bit line BL2 is equal to the ground voltage Vss. Simultaneously, a potential difference across the third and fourth bit lines BL3 and BL4 is amplified so that the voltage value of the third bit line BL3 is equal to the ground voltage Vss and the voltage value of the fourth bit line BL4 is equal to the source voltage Vcc.

At this timing, the first word line WL1 stays activated, so that the source voltage Vcc and the ground voltage Vss are supplied to the first electrodes of the ferroelectric capacitors C1 and C3 through the transistors T1 and T3, respectively. Thus, rewriting in he first and third memory cells 11 and 13 is performed.

In this state, during the drive of the first and second sense amplifiers 26 and 28, the second bit line BL2 with the second reference cell 16 connected thereto is separated from the fourth bit line BL4 with the fourth reference cell 18 connected thereto. This minimizes the current consumption in the device as compared with a conventional ferroelectric memory device which drives sense amplifiers and simultaneously equalizes bit lines to which reference cells retaining different pieces of data are connected.

Subsequently to this series of actions, the reset data signal RPD and the second reset control signal RPG2 are successively activated, thereby performing rewriting in the second and fourth reference cells 16 and 18 by utilizing the second and fourth reset circuits 20 and 22. In this rewriting, the first electrode of the ferroelectric capacitor C8 of the fourth reference cell 18 is supplied with the ground voltage Vss, so that "0" data is written in the fourth reference cell 18. On the other hand, the first electrode of the ferroelectric capacitor C6 of the second reference cell 16 is supplied with a voltage of "H" level serving as a reset data signal RPD, so that "1" data is written in the second reference cell 16.

Next, at the timing of time t5, the sense amplifier driving signal SAE is inactivated to stop the drive of the first and second sense amplifiers 26 and 28, after which the second reference cell plate line RCP2 is activated. In response, of the electrodes of the ferroelectric capacitor C6 of the second reference cell 16, the first electrode is supplied with a voltage of "H" level derived from the reset data signal RPD, and the second electrode is supplied with a voltage of "H" level derived from the second reference cell plate line RCP2. Therefore, the voltage applied to the ferroelectric capacitor C6 of the second reference cell 16 becomes zero volts.

Thereafter, the bit line precharge signal BP is activated and in addition the second reference cell plate line RCP2, the first word line WL1, the reset data signal RPD, and the second reset control signal RPG2 are successively inactivated to restore the device condition to the initial state. The read operation of the device is thus completed.

The foregoing description has been made of the read operation of the first and third memory cells 11 and 13. In the case where the second and fourth memory cells 12 and 14 are read out, "0" data retained in the first reference cell 15 is read out on the first bit line BL1, and "1" data retained in the third reference cell 17 is read out on the third bit line BL3. Then, the first switch circuit 23 is driven to supply the first and third bit lines BL1 and BL3 with the reference potential. The read operation of the second and fourth memory cells 12 and 14 is thus accomplished.

Next description using the drawings will be made of changes in polarization charges of the ferroelectric capacitors accompanied with the read operation in the ferroelectric memory device of the first embodiment.

Figure 3:
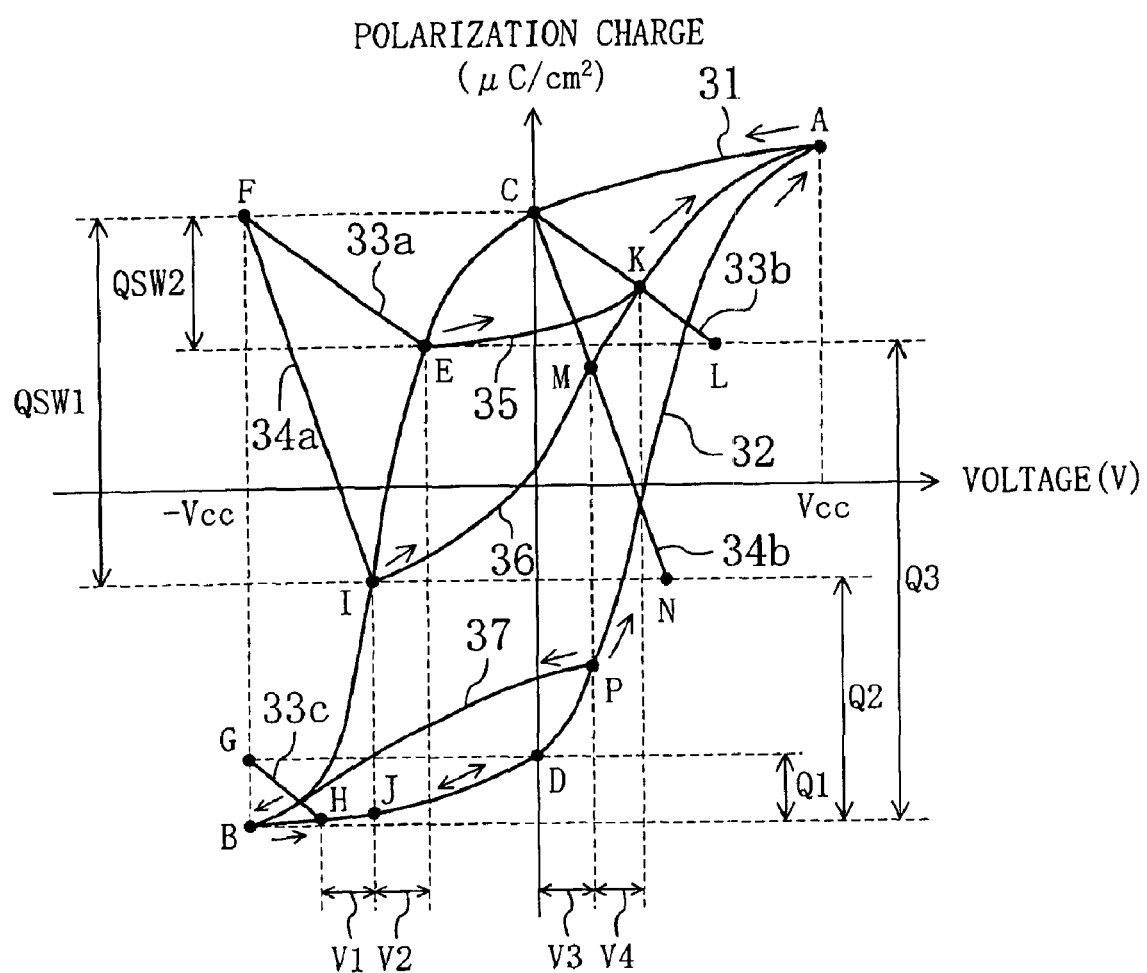
FIG. 3 is a graph showing the hysteresis properties of ferroelectric capacitors in the ferroelectric memory device according to the first embodiment of the present invention.

FIG. 3 is a graph showing the changes (movement on FIG. 3) in the polarization charges of the ferroelectric capacitors accompanied with the read operation in the ferroelectric memory device of the first embodiment, and also showing the hysteresis properties of ferroelectric used in the ferroelectric capacitors. FIG. 3 plots the voltage applied to each ferroelectric capacitor in abscissa and the polarization charge thereof in ordinate. In FIG. 3, a positive polarization charge represents the amount of the polarization charge in the case where the first electrodes of the ferroelectric capacitors C1 to C8 are used as positive electrodes.

As shown in FIG. 3, when the source voltage Vcc in the positive direction is applied to a ferroelectric capacitor, the capacitor stores a polarization charge corresponding to a point A. When the applied voltage is changed from this state in the negative direction, the ferroelectric capacitor stores a polarization charge corresponding to a point to which the point A moves along a curve 31 in the negative direction. In contrast, when the source voltage Vcc in the negative direction is applied to the ferroelectric capacitor, the capacitor stores a polarization charge corresponding to a point B. When the applied voltage is changed from this state in the positive direction, the ferroelectric capacitor stores a polarization charge corresponding to a point to which the point B moves along a curve 32 in the positive direction.

The following description using FIG. 3 is about the movement on FIG. 3 of the polarization charges of the ferroelectric capacitors in accordance with the timings of the read operation shown in FIG. 2.

Note that "L" level in FIG. 2 is set at the ground potential value Vss (0 V) and "H" level in FIG. 2 is set at the source voltage value Vcc (>0 V).

First, at the timing of the time t1 in FIG. 2, no voltage is applied to the ferroelectric capacitors C1 to C8 of the memory cells and the reference cells. Therefore, in the first memory cell 11 and the second reference cell 16 both of which retain "1" data, the polarization charges of the ferroelectric capacitors C1 and C6 are located at a point C in FIG. 3. In the third memory cell 13 and the fourth reference cell 18 both of which retain "0" data, the polarization charges of the ferroelectric capacitors C3 and C8 are located at a point D in FIG. 3.

At the timing of the time t2 in FIG. 2, the transistors T1 and T3 are turned on and the source voltage Vcc as a voltage of "H" level is applied to the first cell plate line CP1. Then, the ground voltage Vss is applied to the first electrodes of the ferroelectric capacitors C1 and C3 and the source voltage Vcc is applied to the second electrodes of the ferroelectric capacitors C1 and C3.

At this timing, in the first memory cell 11, the polarization charge of the ferroelectric capacitor C1 moves from the point C to a point E along the curve 31. The point E is placed at the point determined by dividing the voltage Vcc applied to the ferroelectric capacitor C1 in accordance with the capacitance of the first bit line BL1 and the capacitance of the ferroelectric capacitor C1. To be more specific, the point to which the point C moves along the voltage axis in the negative direction by the source voltage Vcc is defined as a point F, and a capacitance load line 33a of the first bit line BL1 is drawn from the point F. Thus, the point E is obtained as the intersection point of the capacitance load line 33a with the curve 31.

In the third memory cell 13, the polarization charge of the ferroelectric capacitor C3 moves from the point D along the curve 32 in the negative direction, and reaches a point H which is located at the intersection point of the curve 32 with a capacitance load line 33c of the third bit line BL3 drawn from a point G to which the point D moves along the voltage axis in the negative direction by the voltage Vcc. Note that the capacitance of the third bit line BL3 is equal to that of the first bit line BL1, so that the capacitance load line 33c of the third bit line BL3 has the same inclination as the capacitance load line 33a of the first bit line BL1.

Likewise, at this timing, the transistors T6 and T8 are turned on and the source voltage Vcc as a voltage of "H" level is applied to the second reference cell plate line RCP2. Then, the ground voltage Vss is applied to the first electrodes of the ferroelectric capacitors C6 and C8 and the source voltage Vcc is applied to the second electrodes of the ferroelectric capacitors C6 and C8. Each of the ferroelectric capacitors C1, C3, C6 and C8 then changes in the condition from the state in which no voltage is applied to the state in which a negative voltage (−Vcc) is applied thereto. Therefore, in the second reference cell 16, the polarization charge of the ferroelectric capacitor C6 moves from the point C to a point I, and in the fourth reference cell 18, the polarization charge of the ferroelectric capacitor C8 moves from the point D to a point J. Herein, the point I is located at the intersection point of the curve 31 with a capacitance load line 34a of the second bit line BL2. The capacitance load line 34a has a greater inclination than the capacitance load lines 33a and 33c because the second and fourth bit lines BL2 and BL4 are equalized to increase the capacitance values thereof.

By a series of actions performed until the time t2 in FIG. 2, a charge Q3 is read out on the first bit line BL1, and the first bit line BL1 has a potential of "1" data corresponding to the point E. Also, a charge Q2 is read out on the second and fourth bit lines BL2 and BL4, and the second and fourth bit lines BL2 and BL4 have reference potentials corresponding to the points I and J. Further, a charge Q1 is read out on the third bit line BL3, and the third bit line BL3 has a potential of "0" data corresponding to the point H. As a result, a potential difference V1 is created across the first and second bit lines BL1 and BL2, and a potential difference V2 is created across the third and fourth bit lines BL3 and BL4.

Next, at the timing of the time t3 in FIG. 2, the first cell plate line CP1 and the second reference cell plate line RCP2 are inactivated, so that in the first memory cell 11, the third memory cell 13, the second reference cell 16, and the fourth reference cell 18, the voltages applied to the ferroelectric capacitors thereof change from the negative voltage (−Vcc) to zero volts.

By this change, in the first memory cell 11, the polarization charge of the ferroelectric capacitor C1 moves from the point E to a point K along a curve 35. The point K is located at the intersection point of the curve 35 with a capacitance load line 33b of the first bit line BL1 drawn from a point L to which the point E moves along the voltage axis in the positive direction by the voltage Vcc. In the third memory cell 13, the polarization charge of the ferroelectric capacitor C3 moves from the point H to the point D along the curve 32.

Likewise, in the second reference cell 16, the polarization charge of the ferroelectric capacitor C6 moves from the point I to a point M along a curve 36. The point M is located at the intersection point of the curve 36 with a capacitance load line 34b of the second bit line BL2 drawn from a point N to which the point I moves along the voltage axis in the positive direction by the voltage Vcc. In the fourth reference cell 18, the polarization charge of the ferroelectric capacitor C8 moves from the point J to a point P along the curve 32.

At that time, a potential difference V3 corresponding to the potential difference across the points P and D is created across the first and second bit lines BL1 and BL2, and a potential difference V4 corresponding to the potential difference across the points P and N is created across the third and fourth bit lines BL3 and BL4.

Next, at the timing of the time t4 in FIG. 2, the potential difference V4 is amplified by the first sense amplifier 26, whereby the first bit line BL1 has the source voltage Vcc and the second bit line BL2 has the ground voltage Vss. Thus, the first electrode of the ferroelectric capacitor C1 of the first memory cell 11 has the source voltage Vcc applied. Therefore, the polarization charge of the ferroelectric capacitor C1 moves from the point K to the point A along the curve 35. The ferroelectric capacitor C6 of the second reference cell 16 is separated from the second bit line BL2, so that the polarization charge thereof does not move and remains at the point M.

Likewise, the potential difference V3 is amplified by the second sense amplifier 28, whereby the third bit line BL3 has the ground voltage Vss and the fourth bit line BL4 has the source voltage Vcc. Thus, the ferroelectric capacitor C3 of the third memory cell 13 keeps a voltage of zero volts, and the polarization charge thereof does not move and remains at the point D. The ferroelectric capacitor C8 of the fourth reference cell 18 is separated from the fourth bit line BL4, so that the polarization charge thereof does not move and remains at the point P.

Subsequently, the reset data signal RPD and the second reset control signal RPG2 are successively activated, whereby the source voltage Vcc derived from the reset data signal RPD is applied to the first electrode of the ferroelectric capacitor C6 of the second reference cell 16. The voltage applied to the ferroelectric capacitor C6 is then changed from zero volts to a positive voltage. Therefore, the polarization charge of the ferroelectric capacitor C6 moves from the point M to the point A along the curve 35. In the ferroelectric capacitor C8 of the fourth reference cell 18, the ground voltage Vss is applied to the first electrode thereof. As a result, the ferroelectric capacitor C8 keeps a voltage of zero volts and the polarization charge thereof does not move and remains at the point P.

Next, the second reference cell plate line RCP2 is activated subsequently to the timing of the time t5 in FIG. 2, whereby the source voltage Vcc is applied to the second electrodes of the ferroelectric capacitors C6 and C8 of the second and fourth reference cells 16 and 18. The voltage applied to the ferroelectric capacitor C6 is then changed from a positive voltage to zero volts and the polarization charge thereof moves from the point A to the point C along the curve 31. On the other hand, the voltage applied to the ferroelectric capacitor C8 is then changed from zero volts to a negative voltage and the polarization charge thereof moves from the point P to the point B along a curve 37.

Thereafter, the reset data signal RPD and the second reset control signal RPG2 are successively inactivated, so that the voltages of the first electrodes of the ferroelectric capacitors C6 and C8 become zero volts. Also, the second reference cell plate line RCP2 is inactivated, so that the voltages of the second electrodes of the ferroelectric capacitors C6 and C8 become zero volts. From these actions, the ferroelectric capacitor C6 of the second reference cell 16 keeps a voltage of zero volts and the polarization charge thereof remains at the point C. In the fourth reference cell 18, the voltage applied to the ferroelectric capacitor C8 is then changed from a negative voltage to zero volts and the polarization charge thereof moves from the point B to the point D along the curve 32.

The bit line precharge signal BP is activated and the first word line WL1 is inactivated. Then, in the ferroelectric capacitor C1 of the first memory cell 11, the voltage supply from the first bit line BL1 to the first electrode thereof is stopped, so that the voltage applied to the ferroelectric capacitor C1 becomes zero volts. Therefore, the polarization charge thereof moves from the point A to the point C along the curve 31. At that time, the ferroelectric capacitor C3 of the third memory cell 13 keeps a voltage of zero volts, so that the polarization charge thereof does not move and remains at the point C.

As is apparent from the above, the read operation of the memory cells is accomplished so that in the first memory cell 11 retaining "1" data, the polarization charge of the ferroelectric capacitor C1 moves progressively in the order of the point C, the point E, the point K, the point A, and the point C, and that in the third memory cell 13 retaining "0" data, the polarization charge of the ferroelectric capacitor C3 moves progressively in he order of the point D, the point H, the point B, and the point D. The read operation of the reference cells is accomplished so that in the second reference cell 16 retaining "1" data, the polarization charge of the ferroelectric capacitor C6 moves progressively in the order of the point C, the point I, the point M, the point A, and the point C, and that in the fourth reference cell 18 retaining "0" data, the polarization charge of the ferroelectric capacitor C8 moves progressively in the order of the point D, the point J, the point P, the point B, and the point D.

In the read operation of the reference cells described above, the amount of charge for polarization reversal in the ferroelectric capacitors C6 and C8 retaining "0" data is equal to the charge amount QSW1 between the point C and the point I shown in FIG. 3, which is smaller than that of the ferroelectric capacitor of the conventional ferroelectric memory device.

This description has been made of the case where "1" data is retained in the first memory cell 11 and "0" data is retained in the third memory cell 13. If different data are retained in the memory cells, the polarization charges of the ferroelectric capacitors C1 to C4 thereof move according to the data retained in the respective memory cells.

This description has been made of the case where the first and third memory cells 11 and 13 are read out. If the second and fourth memory cells 12 and 14 are read out, a reference potential is generated by utilizing the first and third reference cells. In this case, the polarization charges of the respective ferroelectric capacitors C2, C4, C5 and C7 move according to the data retained in the respective cells.

In the read operation described above, the second switch control signal REQ2 is inactivated before the second reference word line RWL2 is activated, whereby noises caused in the inactivation of the second switch control signal REQ2 are not transferred to the ferroelectric capacitors C6 and C8. This prevents the polarization charges of the ferroelectric capacitors from moving due to the noises accompanied with the inactivation of the second switch control signal REQ2. In particular, when the capacitances of the bit lines are large, the noises accompanied with the inactivation of the second switch control signal REQ2 have a little effect on the potentials of the bit lines. This enables a reliable read operation in the ferroelectric memory device.

As described above, the ferroelectric memory device of the first embodiment makes the amount of charge for polarization reversal of the ferroelectric capacitors C5 to C8 smaller, which reduces stresses placed on the ferroelectric capacitors C5 to C8 during the read operation. Accordingly, the characteristics of the number of rewriting operations can be enhanced in the ferroelectric memory device.

(Modification of First Embodiment)

Hereinafter, a ferroelectric memory device according to an exemplary modification of the first embodiment will be described with reference to the drawings.

The ferroelectric memory device of this modification has a circuit configuration identical to that of the first embodiment shown in FIG. 1, but these devices differ in the read operation control by the control circuit 29. The following description is about the read operation of this modification, considering the difference in the read operation between this modification and the first embodiment.

Figure 4:
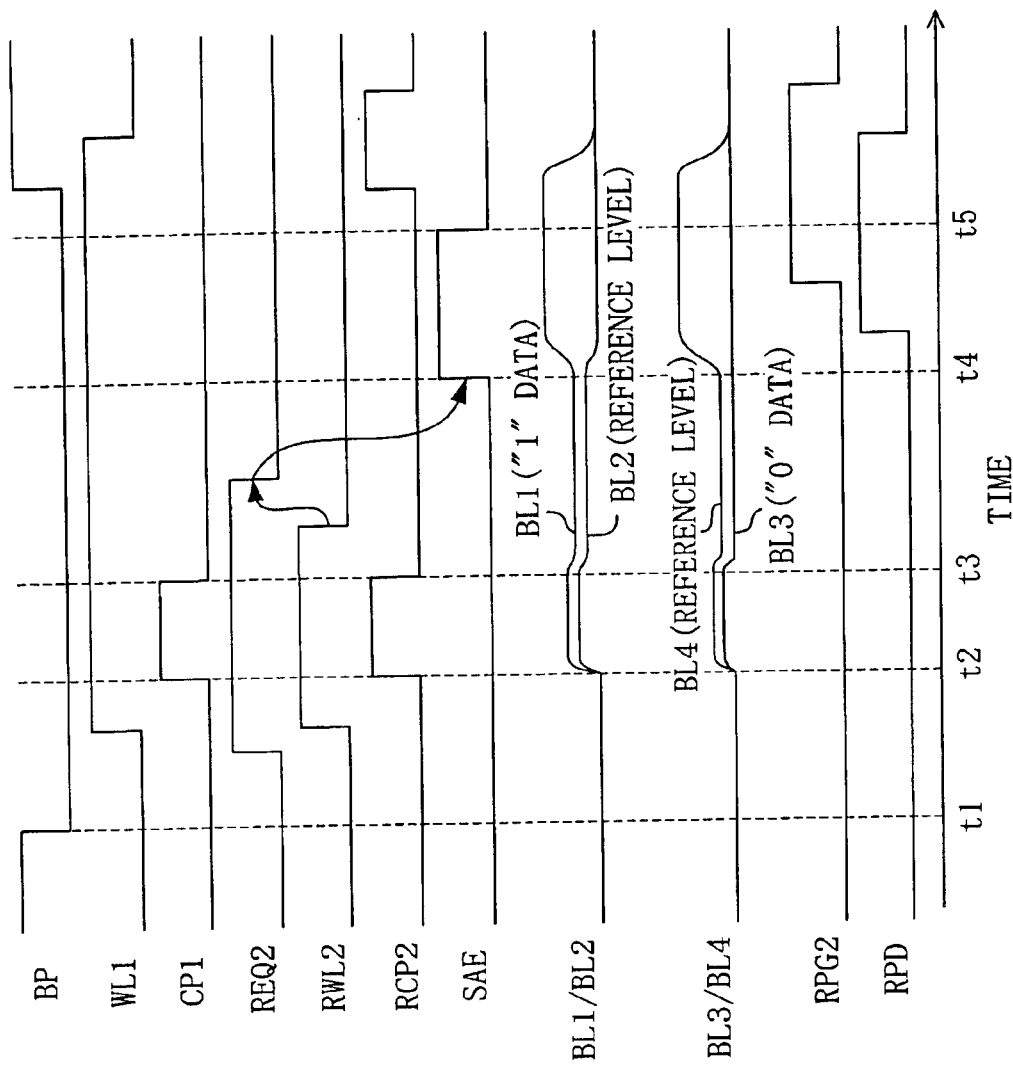
FIG. 4 is a timing chart showing timings of the read operation in a ferroelectric memory device according to a modification of the first embodiment of the present invention.

FIG. 4 shows timings of the read operation in the ferroelectric memory device according to the modification of the first embodiment. As shown in FIG. 4, a series of actions performed from the initial state to the inactivation of the bit line precharge signal BP at time t1 is the same as that of the read operation of the first embodiment performed until the time t1, which is shown in FIG. 2.

Then, prior to the timing of time t2, the second switch control signal REQ2 is activated. Thus, the second switch circuit 24 is driven and the second and fourth bit lines BL2 and BL4 are equalized.

At the timing of the time t2, the first word line WL1, the first cell plate line CP1, the second reference word line RWL2, and the second reference cell plate line RCP2 are activated.

In response, the transistors T1 and T3 are turned on and a voltage of "H" level is applied to the second electrodes of the ferroelectric capacitors C1 and C3. Then, data retained in the first memory cell 11 is supplied to the first bit line BL1 and data retained in the third memory cell 13 is supplied to the third bit line BL3.

In addition, the transistors T6 and T8 are turned on and a voltage of "H" level is applied to the second electrodes of the ferroelectric capacitors C6 and C8. Then, "1" data retained in the second reference cell 16 is supplied to the second bit line BL2 and "0" data retained in the fourth reference cell 18 is supplied to the fourth bit line BL4.

At this timing, the second and fourth bit lines BL2 and BL4 have already been equalized, so that the period of time until the potentials of the second and fourth bit lines BL2 and BL4 become a reference potential can be reduced.

As shown in FIG. 4, the first word line WL1 and the second reference word line RWL2 are activated subsequently to the activation of the second switch control signal REQ2 and prior to the time t2. Alternatively, these two lines may be activated either concurrently with the first cell plate line CP1 and the second reference cell plate line RCP2, or concurrently with the second switch control signal REQ2.

Thereafter, the first cell plate line CP1 and the second reference cell plate line RCP2 are inactivated at the timing of time t3. All the actions that follow are identical to the actions in the read operation of the first embodiment performed at the time t3 and afterward, which are shown in FIG. 2, and omitted from this description.

Changes in charges in the ferroelectric accompanied with the read operation described above are the same as those in the first embodiment. Accordingly, the amount of charge for polarization reversal in the read operation of the reference cell is smaller than that of a conventional ferroelectric memory device.

The ferroelectric memory device according to this modification attains the same effects as the ferroelectric memory device of the first embodiment. Moreover, in order to keep the first cell plate line CP1 and the second reference cell plate line RCP2 activated for a predetermined period of time after the second switch control signal REQ2 is activated, the first cell plate line CP1 and the second reference cell plate line RCP2 are activated with the equalization time secured by the activation of the second switch control signal REQ2. This contributes to the reduction of the time until the potentials of the second and fourth bit lines BL2 and BL4 become a reference potential. As a result, the ferroelectric memory device can attain a faster read operation.

(Second Embodiment)

Hereinafter, a ferroelectric memory device according to a second embodiment will be described with reference to the drawings.

The ferroelectric memory device of the second embodiment has a circuit configuration identical to that of the first embodiment shown in FIG. 1, but these devices differ in the read operation control by the control circuit 29. The following description is about the read operation of the second embodiment, considering the difference in the read operation between the second embodiment and the first embodiment.

Figure 5:
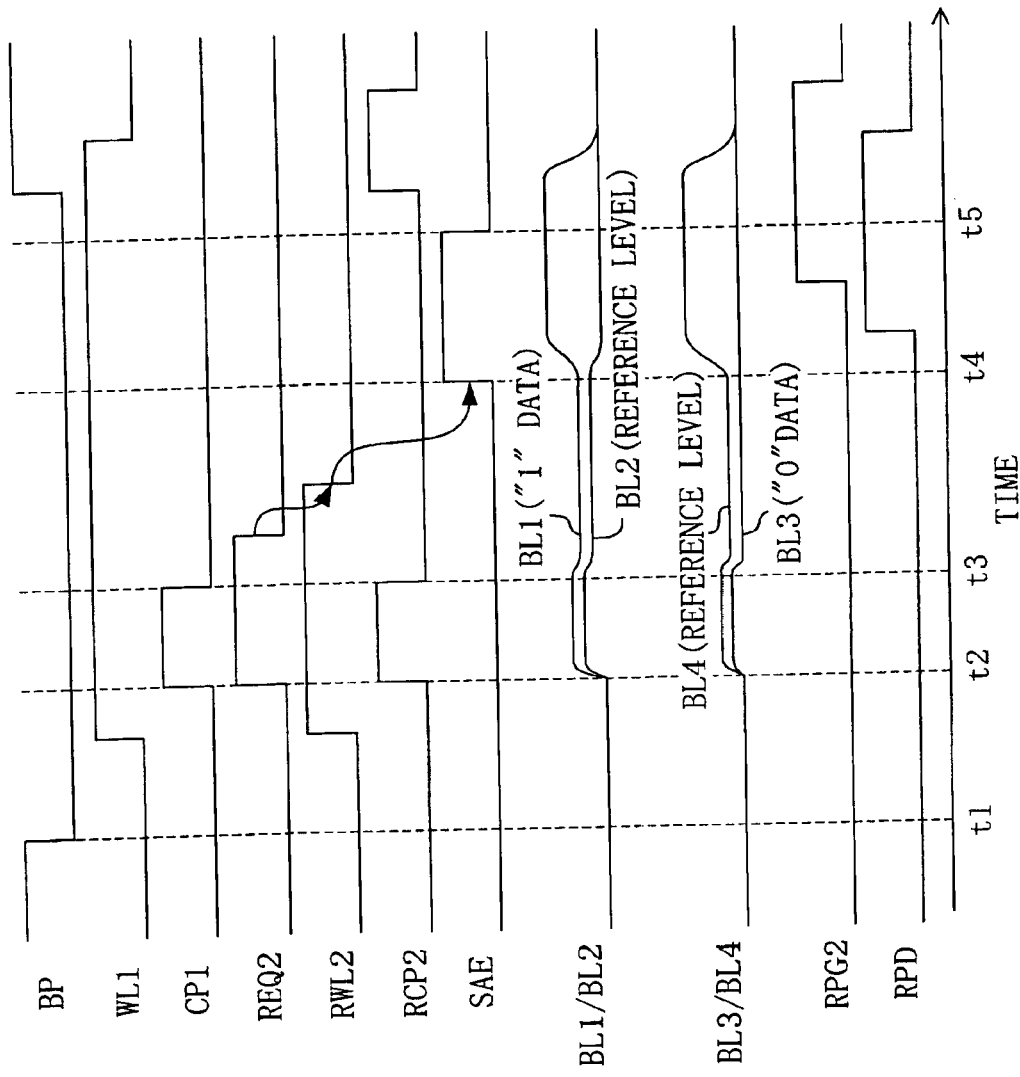
FIG. 5 is a timing chart showing timings of the read operation in a ferroelectric memory device according to a second embodiment of the present invention.

FIG. 5 shows timings of the read operation in the ferroelectric memory device according to the second embodiment. As shown in FIG. 5, a series of actions performed from the initial state to the inactivation of the first cell plate line CP1 and the second reference cell plate line RCP2 at time t3 is the same as that of the read operation of the first embodiment performed until the time t3, which is shown in FIG. 2.

Subsequently to these actions and prior to the timing of time t4, the second switch control signal REQ2 and the second reference word line RWL2 are successively inactivated. In response, the second switch circuit 24 is stopped to separate the second bit line BL2 from the fourth bit line BL4, after which the transistors T6 and T8 are turned off to separate the second and fourth reference cells 16 and 18 from the second and fourth bit lines BL2 and BL4, respectively.

At that time, equalization is stopped with the capacitances of the ferroelectric capacitors C6 and C8 added to the second and fourth bit lines BL2 and BL4. Therefore, when in particular the capacitances of the bit lines are small, noises accompanied with the inactivation of the second switch control signal REQ2 are reduced.

Thereafter, the sense amplifier driving signal SAE is activated at the timing of time t4. All the actions that follow are identical to the actions in the read operation of the first embodiment performed at the time t4 and afterward, which are shown in FIG. 2, and omitted from this description.

Changes (movement on FIG. 3) in the polarization charges of the ferroelectric capacitors accompanied with the read operation of the ferroelectric memory device of the second embodiment are identical to those of the first embodiment. To be more specific, the read operation of a memory cell is accomplished so that in a memory cell retaining "1" data, the polarization charge of the ferroelectric capacitor thereof moves progressively in the order of the point C, the point E, the point K, the point A, and the point C, and that in a memory cell retaining "0" data, the polarization charge of the ferroelectric capacitor thereof moves progressively in the order of the point D, the point H, the point B, and the point D. The read operation of a reference cell is accomplished so that in a reference cell retaining "1" data, the polarization charge of the ferroelectric capacitor thereof moves progressively in the order of the point C, the point I, the point M, the point A, and the point C, and that in a reference cell retaining "0" data, the polarization charge of the ferroelectric capacitor thereof moves progressively in the order of the point D, the point J, the point P, the point B, and the point D.

As described above, the ferroelectric memory device of the second embodiment makes the amount of charge for polarization reversal smaller as in the case of the first embodiment, which enhances the characteristics of the number of rewriting operations in the ferroelectric memory device.

In the read operation of the second embodiment, moreover, the second switch control signal REQ2 is inactivated, after which the second reference word line RWL2 is inactivated. Therefore, when the capacitances of the bit lines are small, noises accompanied with the inactivation of the second switch control signal REQ2 have a little effect on the bit lines. This enables a highly-reliable read operation in the ferroelectric memory device.

Also in the second embodiment, the second switch control signal REQ2 is activated prior to the timing of the time t2 as in the case of the modification of the first embodiment. Thus, a high speed operation of the ferroelectric memory device can be performed while the activation time of the second switch control signal REQ2 coincides with the activation time of the first cell plate line CP1 and the second reference cell plate line RCP2.

(Third Embodiment)

Hereinafter, a ferroelectric memory device according to a third embodiment will be described with reference to the drawings.

The ferroelectric memory device of the third embodiment has a circuit configuration identical to that of the first embodiment shown in FIG. 1, but these devices differ in the read operation control by the control circuit 29. The following description is about the read operation of the third embodiment, considering the difference in the read operation between the third embodiment and the first embodiment.

FIG. 6 shows timings of the read operation in the ferroelectric memory device according to the third embodiment.

As shown in FIG. 6, a series of actions performed from the initial state to the activation of the first cell plate line CP1 and the second reference cell plate line RCP2 at time t2 is the same as that of the read operation of the first embodiment performed until the time t2, which is shown in FIG. 2. In response, a voltage of "H" level is applied to the second electrodes of the ferroelectric capacitors C1 and C3 and the second electrodes of the ferroelectric capacitors C6 and C8. This initiates data output from the first memory cell 11, the third memory cell 13, the second reference cell 16, and the fourth reference cell 18 to the respective bit lines.

Subsequently to this action and prior to the timing of time t3, the second reference word line RWL2 and the second switch control signal REQ2 are successively inactivated. In response, the second switch circuit 24 is stopped to separate the second bit line BL2 from the fourth bit line BL4, after which the transistors T6 and T8 are turned off to separate the second and fourth reference cells 16 and 18 from the second and fourth bit lines BL2 and BL4, respectively.

Then, at the timing of time t3, the sense amplifier driving signal SAE is activated to drive the first and second sense amplifiers 26 and 28. In response, a potential difference across the first and second bit lines BL1 and BL2 is amplified so that the voltage value of the first bit line BL1 is equal to the source voltage Vcc and the voltage value of the second bit line BL2 is equal to the ground voltage Vss. Simultaneously, a potential difference across the third and fourth bit lines BL3 and BL4 is amplified so that the voltage value of the third bit line BL3 is equal to the ground voltage Vss and the voltage value of the fourth bit line BL4 is equal to the source voltage Vcc.

Next, at the timing of time t4, the first cell plate line CP1 and the second reference cell plate line RCP2 are inactivated. This stops voltage supply to the second electrodes of the ferroelectric capacitors C1 and C3 and the second electrodes of the ferroelectric capacitors C6 and C8, which stops data output from the first and third memory cells 11 and 13 and the second and fourth reference cells 16 and 18 to the respective bit lines.

Next, the sense amplifier driving signal SAE is inactivated at the timing of time t5. Thereafter, the bit line precharge signal BP is activated and the first word line WL1 is inactivated, whereby the read operation of the first and third memory cells 11 and 13 is completed.

In this case, in the first and third memory cells 11 and 13, the transistors T1 and T3 are on during the drive of the first and second sense amplifiers 26 and 28. Therefore, "1" data and "0" data are rewritten in the first and third memory cells 11 and 13 in correspondence with the potentials of the first and third bit lines BL1 and BL3, respectively.

In the second and fourth reference cells 16 and 18, the second reference word line RWL2 is inactivated, and then the reset data signal RPD is activated to have a voltage of "H" level. Thereafter, the second reference cell plate line RCP2 is inactivated, and then the second reset control signal RPG2 is activated. Thus, the second reset circuit 22 is driven to rewrite "1" data in the second reference cell 16, and the fourth reset circuit 24 is driven to rewrite "0" data in the fourth reference cell 18.

Next description using FIG. 3 will be made of changes (movement on FIG. 3) in polarization charges of the ferroelectric capacitors accompanied with the read operation in the ferroelectric memory device of the third embodiment. Note that "L" level in FIG. 6 is set at the ground potential value Vss (0 V) and "H" level in FIG. 6 is set at the source voltage value Vcc (>0 V).

First, at the timing of the time t1 in FIG. 6, no voltage is applied to the ferroelectric capacitors C1 to C8 of the memory cells and the reference cells. Therefore, in the first memory cell 11 and the second reference cell 16 both of which retain "1" data, the polarization charges of the ferroelectric capacitors C1 and C6 are located at the point C in FIG. 3. In the third memory cell 13 and the fourth reference cell 18 both of which retain "0" data, the polarization charges of the ferroelectric capacitors C3 and C8 are located at the point D in FIG. 3.

Subsequently, at the timing of the time t2 in FIG. 6, the transistors T1 and T3 are turned on and the source voltage Vcc as a voltage of "H" level is applied to the first cell plate line CP1. Then, the ground voltage Vss is applied to the first electrodes of the ferroelectric capacitors C1 and C3 and the source voltage Vcc is applied to the second electrodes of the ferroelectric capacitors C1 and C3. Likewise, the transistors T6 and T8 are turned on and the source voltage Vcc as a voltage of "H" level is applied to the second reference cell plate line RCP2. Then, the ground voltage Vss is applied to the first electrodes of the ferroelectric capacitors C6 and C8 and the source voltage Vcc is applied to the second electrodes of the ferroelectric capacitors C6 and C8. Each of the ferroelectric capacitors C1, C3, C6 and C8 then changes in the condition from the state in which no voltage is applied to the state in which a negative voltage (−Vcc) is applied thereto.

At this timing, in the first memory cell 11, the polarization charge of the ferroelectric capacitor C1 moves from the point C to the point E along the curve 31. In the third memory cell 13, the polarization charge of the ferroelectric capacitor C3 moves from the point D to the point H along the curve 32. Likewise, in the second reference cell 16, the polarization charge of the ferroelectric capacitor C6 moves from the point C to the point I, and in the fourth reference cell 18, the polarization charge of the ferroelectric capacitor C8 moves from the point D to the point J.

At that time, a charge Q3 is read out on the first bit line BL1, and the first bit line BL1 has a potential of "1" data corresponding to the point E. Also, a charge Q2 is read out on the second and fourth bit lines BL2 and BL4, and the second and fourth bit lines BL2 and BL4 have reference potentials corresponding to the points I and J. Further, a charge Q1 is read out on the third bit line BL3, and the third bit line BL3 has a potential of "0" data corresponding to the point H. As a result, a potential difference V1 is created across the first and second bit lines BL1 and BL2, and a potential difference V2 is created across the third and fourth bit lines BL3 and BL4.

Next, at the timing of the time t3 in FIG. 6, the potential difference V2 is amplified by the first sense amplifier 26, whereby the first bit line BL1 has the source voltage Vcc and the second bit line BL2 has the ground voltage Vss. Thus, the first electrode of the ferroelectric capacitor C1 of the first memory cell 11 has the source voltage Vcc applied by the first bit line BL1, and the second electrode thereof has the source voltage Vcc applied by the first cell plate line CP1. Therefore, the polarization charge of the ferroelectric capacitor C1 moves from the point E to the point K along the curve 35. The ferroelectric capacitor C6 of the second reference cell 16 is separated from the second bit line BL2, so that the polarization charge thereof does not move and remains at the point I.

Likewise, the potential difference V1 is amplified by the second sense amplifier 28, whereby the third bit line BL3 has the ground voltage Vss and the fourth bit line BL4 has the source voltage Vcc. Thus, the ferroelectric capacitor C3 of the third memory cell 13 keeps a negative voltage (−Vcc) applied, and the polarization charge thereof does not move and remains at the point H. The ferroelectric capacitor C8 of the fourth reference cell 18 is separated from the fourth bit line BL4, so that the polarization charge thereof does not move and remains at the point J.

Next, at the timing of the time t4 in FIG. 6, the first cell plate line CP1 and the second reference cell plate line RCP2 are inactivated, so that in the first memory cell 11, the third memory cell 13, the second reference cell 16, and the fourth reference cell 18, the voltages applied to the ferroelectric capacitors C1, C3, C6 and C8 thereof change to voltages in the positive direction.

By this change, in the first memory cell 11, the polarization charge of the ferroelectric capacitor C1 moves from the point K to the point A along the curve 35. In the third memory cell 13, the polarization charge of the ferroelectric capacitor C3 moves from the point H to the point D along the curve 32.

Likewise, in the second reference cell 16, the polarization charge of the ferroelectric capacitor C6 moves from the point I to the point M along the curve 36. In the fourth reference cell 18, the polarization charge of the ferroelectric capacitor C8 moves from the point J to the point D along the curve 32.

Subsequently, the sense amplifier driving signal SAE is inactivated and then the first word line WL1 is inactivated, whereby the first electrodes of the ferroelectric capacitors C1 and C3 in the first and third memory cells 11 and 13 each have a voltage of zero volts. Thus, the voltage of the ferroelectric capacitor C1 is changed to zero volts so that the polarization charge thereof moves from the point A to the point C along the curve 31. On the other hand, the ferroelectric capacitor C3 keeps a voltage of zero volts and the polarization charge thereof does not move and remains at the point D.

Furthermore, the second reference cell plate line RCP2 is inactivated and then the second reset control signal RPG2 is activated. Thus, the source voltage Vcc as the reset data signal RPD is applied to the first electrode of the ferroelectric capacitor C6 of the second reference cell 16, while the ground voltage Vss is applied to the first electrode of the ferroelectric capacitor C8 of the fourth reference cell 18. As a result, the ferroelectric capacitor C6 is changed to a state that a positive voltage is applied, so that the polarization charge thereof moves from the point M to the point A along the curve 35. On the other hand, the ferroelectric capacitor C8 keeps a voltage of zero volts, so that the polarization charge thereof does not move and remains at the point D.

Thereafter, the reset data signal RPD and the second reset control signal RPG2 are successively inactivated subsequently to the timing of the time t5 in FIG. 6, so that the voltages of the first electrodes of the ferroelectric capacitors C6 and C8 become zero volts. From these actions, in the second reference cell 16, the voltage applied to the ferroelectric capacitor C6 is then changed from a positive voltage to zero volts and the polarization charge thereof moves from the point A to the point C along the curve 31. In the fourth reference cell 18, the ferroelectric capacitor C8 thereof keeps a voltage of zero volts, so that the polarization charge thereof does not move and remains at the point D.

The movement on FIG. 3 of the polarization charges in the ferroelectric capacitors accompanied with the read operation of the ferroelectric memory device of the third embodiment is as follows. In a memory cell retaining "1" data, the polarization charge of the ferroelectric capacitor thereof moves progressively in the order of the point C, the point E, the point K, the point A, and the point C, and in a memory cell retaining "0" data, the polarization charge of the ferroelectric capacitor thereof moves progressively in the order of the point D, the point H, the point B, and the point D. Regarding reference cells, in a reference cell retaining "1" data, the polarization charge of the ferroelectric capacitor thereof moves progressively in the order of the point C, the point I, the point M, the point A, and the point C, and in a reference cell retaining "0" data, the polarization charge of the ferroelectric capacitor thereof moves progressively in the order of the point D, the point J, and the point D.

As described above, the ferroelectric memory device of the third embodiment makes the amount of charge for polarization reversal smaller as in the case of the first embodiment, which enhances the characteristics of the number of rewriting operations in the ferroelectric memory device.

Moreover, the cell plate line and the reference plate line are activated even during the drive of the sense amplifier, which raises the potential of the bit line in the inactivation of the switch control signal. This reduces the effect of noises accompanied with the inactivation of the switch control signal, which enables a highly-reliable read operation in the ferroelectric memory device.

Also in the third embodiment, the second switch control signal REQ2 is activated prior to the timing of the time t2 as in the case of the modification of the first embodiment. Thus, a high speed operation of the ferroelectric memory device can be performed while the activation time of the second switch control signal REQ2 coincides with the activation time of the first cell plate line CP1 and the second reference cell plate line RCP2.

(Fourth Embodiment)

Hereinafter, a ferroelectric memory device according to a fourth embodiment will be described with reference to the drawings.

The ferroelectric memory device of the fourth embodiment has a circuit configuration identical to that of the first embodiment shown in FIG. 1, but these devices differ in the read operation control by the control circuit 29. The following description is about the read operation of the fourth embodiment, considering the difference in the read operation between the fourth embodiment and the first embodiment.

FIG. 7 shows timings of the read operation in the ferroelectric memory device according to the fourth embodiment.

As shown in FIG. 7, a series of actions performed from the initial state to the activation of the first cell plate line CP1 and the second reference cell plate line RCP2 at time t2 is the same as that of the read operation of the first embodiment performed until the time t2, which is shown in FIG. 2. In response, a voltage of "H" level is applied to the second electrodes of the ferroelectric capacitors C1 and C3 and the second electrodes of the ferroelectric capacitors C6 and C8. This initiates data output from the first memory cell 11, the third memory cell 13, the second reference cell 16, and the fourth reference cell 18 to the respective bit lines.

Subsequently to this action and prior to the timing of time t3, the second switch control signal REQ2 and the second reference word line RWL2 are successively inactivated. In response, the second switch circuit 24 is stopped to separate the second bit line BL2 from the fourth bit line BL4, after which the transistors T6 and T8 are turned off to separate the second and fourth reference cells 16 and 18 from the second and fourth bit lines BL2 and BL4, respectively.

Then, at the timing of time t3, the sense amplifier driving signal SAE is activated to drive the first and second sense amplifiers 26 and 28. In response, a potential difference across the first and second bit lines BL1 and BL2 is amplified so that the voltage value of the first bit line BL1 is equal to the source voltage Vcc and the voltage value of the second bit line BL2 is equal to the ground voltage Vss. Simultaneously, a potential difference across the third and fourth bit lines BL3 and BL4 is amplified so that the voltage value of the third bit line BL3 is equal to the ground voltage Vss and the voltage value of the fourth bit line BL4 is equal to the source voltage Vcc.

Next, at the timing of time t4, the first cell plate line CP1 and the second reference cell plate line RCP2 are inactivated. This stops voltage supply to the second electrodes of the ferroelectric capacitors C1 and C3 and the second electrodes of the ferroelectric capacitors C6 and C8, which stops data output from the first and third memory cells 11 and 13 and the second and fourth reference cells 16 and 18 to the respective bit lines.

Thereafter, the sense amplifier driving signal SAE is inactivated at the timing of time t5. All the actions that follow are identical to the actions in the read operation of the third embodiment performed at the time t5 and afterward, which are shown in FIG. 6, and omitted from this description.

Next description using FIG. 3 will be made of changes (movement on FIG. 3) in polarization charges of the ferroelectric capacitors accompanied with the read operation in the ferroelectric memory device of the fourth embodiment. Note that "L" level in FIG. 7 is set at the ground potential value Vss (0 V) and "H" level in FIG. 7 is set at the source voltage value Vcc (>0 V).

First, at the timing of the time t1 in FIG. 7, no voltage is applied to the ferroelectric capacitors C1 to C8 of the memory cells and the reference cells. Therefore, in the first memory cell 11 and the second reference cell 16 both of which retain "1" data, the polarization charges of the ferroelectric capacitors C1 and C6 are located at the point C in FIG. 3. In the third memory cell 13 and the fourth reference cell 18 both of which retain "0" data, the polarization charges of the ferroelectric capacitors C3 and C8 are located at the point D in FIG. 3.

At the timing of the time t2 in FIG. 7, the transistors T1 and T3 are turned on and the source voltage Vcc as a voltage of "H" level is applied to the first cell plate line CP1. Then, the ground voltage Vss is applied to the first electrodes of the ferroelectric capacitors C1 and C3 and the source voltage Vcc is applied to the second electrodes of the ferroelectric capacitors C1 and C3. Likewise, the transistors T6 and T8 are turned on and the source voltage Vcc as a voltage of "H" level is applied to the second reference cell plate line RCP2. Then, the ground voltage Vss is applied to the first electrodes of the ferroelectric capacitors C6 and C8 and the source voltage Vcc is applied to the second electrodes of the ferroelectric capacitors C6 and C8. Each of the ferroelectric capacitors C1, C3, C6 and C8 then changes in the condition from the state in which no voltage is applied to the state in which a negative voltage (–Vcc) is applied thereto.

At this timing, in the first memory cell 11, the polarization charge of the ferroelectric capacitor C1 moves from the point C to the point E along the curve 31. In the third memory cell 13, the polarization charge of the ferroelectric capacitor C3 moves from the point D to the point H along the curve 32. Likewise, in the second reference cell 16, the polarization charge of the ferroelectric capacitor C6 moves from the point C to the point I, and in the fourth reference cell 18, the polarization charge of the ferroelectric capacitor C8 moves from the point D to the point J.

At that time, a charge Q3 is read out on the first bit line BL1, and the first bit line BL1 has a potential of "1" data corresponding to the point E. Also, a charge Q2 is read out on the second and fourth bit lines BL2 and BL4, and the second and fourth bit lines BL2 and BL4 have reference potentials corresponding to the points I and J. Further, a charge Q1 is read out on the third bit line BL3, and the third bit line BL3 has a potential of "0" data corresponding to the point H. As a result, a potential difference V1 is created across the first and second bit lines BL1 and BL2, and a potential difference V2 is created across the third and fourth bit lines BL3 and BL4.

Next, at the timing of the time t3 in FIG. 7, the potential difference V2 is amplified by the first sense amplifier 26, whereby the first bit line BL1 has the source voltage Vcc and the second bit line BL2 has the ground voltage Vss. Thus, the first electrode of the ferroelectric capacitor C1 of the first memory cell 11 has the source voltage Vcc applied by the first bit line BL1, and the second electrode thereof has the source voltage Vcc applied by the first cell plate line CP1. Therefore, the polarization charge of the ferroelectric capacitor C1 moves from the point E to the point K along the curve 35. The ferroelectric capacitor C6 of the second reference cell 16 is separated from the second bit line BL2, so that the polarization charge thereof does not move and remains at the point I.

Likewise, the potential difference V1 is amplified by the second sense amplifier 28, whereby the third bit line BL3 has the ground voltage Vss and the fourth bit line BL4 has the source voltage Vcc. Thus, the ferroelectric capacitor C3 of the third memory cell 13 keeps a negative voltage (−Vcc) applied, so that the polarization charge thereof does not move and remains at the point H. The ferroelectric capacitor C8 of the fourth reference cell 18 is separated from the fourth bit line BL4, so that the polarization charge thereof does not move and remains at the point J.

Next, at the timing of the time t4 in FIG. 7, the first cell plate line CP1 and the second reference cell plate line RCP2 are inactivated, so that in the first memory cell 11, the third memory cell 13, the second reference cell 16, and the fourth reference cell 18, the voltages applied to the ferroelectric capacitors C1, C3, C6 and C8 thereof change to voltages in the positive direction.

By this change, in the first memory cell 11, the polarization charge of the ferroelectric capacitor C1 moves from the point K to the point A along the curve 35. In the third memory cell 13, the polarization charge of the ferroelectric capacitor C3 moves from the point H to the point D along the curve 32.

Likewise, in the second reference cell 16, the polarization charge of the ferroelectric capacitor C6 moves from the point I to the point M along the curve 36. In the fourth reference cell 18, the polarization charge of the ferroelectric capacitor C8 moves from the point J to the point D along the curve 32.

Subsequently, the sense amplifier driving signal SAE is inactivated and then the first word line WL1 is inactivated, whereby the first electrodes of the ferroelectric capacitors C1 and C3 in the first and third memory cells 11 and 13 each have a voltage of zero volts. Thus, the voltage of the ferroelectric capacitor C1 is changed to zero volts so that the polarization charge thereof moves from the point A to the point C along the curve 31. On the other hand, the ferroelectric capacitor C3 keeps a voltage of zero volts and the polarization charge thereof does not move and remains at the point D.

Furthermore, the second reference cell plate line RCP2 is inactivated and then the second reset control signal RPG2 is activated. Thus, the source voltage Vcc as the reset data signal RPD is applied to the first electrode of the ferroelectric capacitor C6 of the second reference cell 16, while the ground voltage Vss is applied to the first electrode of the ferroelectric capacitor C8 of the fourth reference cell 18. As a result, the ferroelectric capacitor C6 is changed to a state that a positive voltage is applied, so that the polarization charge thereof moves from the point M to the point A along the curve 35. On the other hand, the ferroelectric capacitor C8 keeps a voltage of zero volts, so that the polarization charge thereof does not move and remains at the point D.

Thereafter, the reset data signal RPD and the second reset control signal RPG2 are successively inactivated subsequently to the timing of the time t5 in FIG. 7, so that the voltages of the first electrodes of the ferroelectric capacitors C6 and C8 become zero volts. From these actions, in the second reference cell 16, the voltage applied to the ferroelectric capacitor C6 is then changed from a positive voltage to zero volts and the polarization charge thereof moves from the point A to the point C along the curve 31. In the fourth reference cell 18, the ferroelectric capacitor C8 thereof keeps a voltage of zero volts, so that the polarization charge thereof does not move and remains at the point D.

The movement on FIG. 3 of the polarization charges in the ferroelectric capacitors accompanied with the read operation of the ferroelectric memory device of the fourth embodiment is as follows. In a memory cell retaining "1" data, the polarization charge of the ferroelectric capacitor thereof moves progressively in the order of the point C, the point E, the point K, the point A, and the point C, and in a memory cell retaining "0" data, the polarization charge of the ferroelectric capacitor thereof moves progressively in the order of the point D, the point H, the point B, and the point D. Regarding reference cells, in a reference cell retaining "1" data, the polarization charge of the ferroelectric capacitor thereof moves progressively in the order of the point C, the point I, the point M, the point A, and the point C, and in a reference cell retaining "0" data, the polarization charge of the ferroelectric capacitor thereof moves progressively in the order of the point D, the point J, and the point D.

As described above, the ferroelectric memory device of the fourth embodiment makes the amount of charge for polarization reversal smaller as in the case of the first embodiment, which enhances the characteristics of the number of rewriting operations in the ferroelectric memory device.

In the read operation of the fourth embodiment, moreover, the cell plate line and the reference plate line are activated even during the drive of the sense amplifier, which raises the potential of the bit line in the inactivation of the switch control signal. This reduces the effect of noises accompanied with the inactivation of the switch control signal, which enables a highly-reliable read operation in the ferroelectric memory device.

Also in the fourth embodiment, the second switch control signal REQ2 is activated prior to the timing of the time t2 as in the case of the modification of the first embodiment. Thus, a high speed operation of the ferroelectric memory device can be performed while the activation time of the second switch control signal REQ2 coincides with the activation time of the first cell plate line CP1 and the second reference cell plate line RCP2.

(Fifth Embodiment)

Hereinafter, a ferroelectric memory device according to a fifth embodiment will be described with reference to the drawings.

The ferroelectric memory device of the fifth embodiment has a circuit configuration identical to that of the first embodiment shown in FIG. 1, but these devices differ in the read operation control by the control circuit 29. The following description is about the read operation of the fifth embodiment, considering the difference in the read operation between the fifth embodiment and the first embodiment.

FIG. 8 shows timings of the read operation in the ferroelectric memory device according to the fifth embodiment.

As shown in FIG. 8, a series of actions performed from the initial state to the inactivation of the bit line precharge signal BP at time t1 is the same as that of the read operation of the first embodiment performed until the time t1, which is shown in FIG. 2.

Subsequently, at the timing of the time t2, the first word line WL1, the first cell plate line CP1, the second reference word line RWL2, and the second reference cell plate line RCP2 are activated.

In response, the transistors T1 and T3 are turned on and a voltage of "H" level is applied to the second electrodes of the ferroelectric capacitors C1 and C3. Then, data retained in the first memory cell 11 is supplied to the first bit line BL1 and data retained in the third memory cell 13 is supplied to the third bit line BL3.

In addition, the transistors T6 and T8 are turned on and a voltage of "H" level is applied to the second electrodes of the ferroelectric capacitors C6 and C8. Then, "1" data retained in the second reference cell 16 is supplied to the second bit line BL2 and "0" data retained in the fourth reference cell 18 is supplied to the fourth bit line BL4.

Next, at the timing of time t3, the first cell plate line CP1 and the second reference cell plate line RCP2 are inactivated. This stops voltage supply to the second electrodes of the ferroelectric capacitors C1 and C3 and the second electrodes of the ferroelectric capacitors C6 and C8, which stops data output from the first and third memory cells 11 and 13 and the second and fourth reference cells 16 and 18 to the respective bit lines BL1 to BL4.

Subsequently to this action and prior to the timing of time t4, the second switch control signal REQ2 is kept activated for a predetermined period of time. In response, the second switch circuit 24 is driven to equalize the second and fourth bit lines BL2 and BL4. As a result, the second and fourth bit lines BL2 and BL4 have, as a reference potential, an intermediate potential between the potential corresponding to "1" data and the potential corresponding to "0" data.

Subsequently to this, the second reference word line RWL2 is successively inactivated. In response, the transistors T6 and T8 are turned off to separate the second and fourth reference cells 16 and 18 from the second and fourth bit lines BL2 and BL4, respectively.

Then, at the timing of time t4, the sense amplifier driving signal SAE is activated to drive the first and second sense amplifiers 26 and 28. In response, a potential difference across the first and second bit lines BL1 and BL2 is amplified so that the voltage value of the first bit line BL1 is equal to the source voltage Vcc and the voltage value of the second bit line BL2 is equal to the ground voltage Vss. Simultaneously, a potential difference across the third and fourth bit lines BL3 and BL4 is amplified so that the voltage value of the third bit line BL3 is equal to the ground voltage Vss and the voltage value of the fourth bit line BL4 is equal to the source voltage Vcc.

Next, the reset data signal RPD and the second reset control signal RPG2 are successively activated, thereby performing rewriting in the second and fourth reference cells 16 and 18 by utilizing the second and fourth reset circuits 20 and 22. In this rewriting, the first electrode of the ferroelectric capacitor C6 of the second reference cell 16 is supplied with the ground voltage Vss, so that "0" data is written in the second reference cell 16. On the other hand, the first electrode of the ferroelectric capacitor C8 of the fourth reference cell 18 is supplied with a voltage of "H" level serving as a reset data signal RPD, so that "1" data is written in the fourth reference cell 18.

Thereafter, the bit line precharge signal BP is activated and in addition the first word line WL1, the reset data signal RPD, and the second reset control signal RPG2 are successively inactivated to restore the device condition to the initial state. The read operation of the device is thus completed.

Next description using FIG. 3 will be made of changes (movement on FIG. 3) in polarization charges of the ferroelectric capacitors accompanied with the read operation in the ferroelectric memory device of the fifth embodiment. Note that "L" level in FIG. 8 is set at the ground potential value Vss (0 V) and "H" level in FIG. 8 is set at the source voltage value Vcc (>0 V).

First, at the timing of the time t1 in FIG. 8, no voltage is applied to the ferroelectric capacitors C1 to C8 of the memory cells and the reference cells. Therefore, in the first memory cell 11 and the second reference cell 16 both of which retain "1" data, the polarization charges of the ferroelectric capacitors C1 and C6 are located at the point C in FIG. 3. In the third memory cell 13 and the fourth reference cell 18 both of which retain "0" data, the polarization charges of the ferroelectric capacitors C3 and C8 are located at the point D in FIG. 3.

At the timing of the time t2 in FIG. 8, the transistors T1 and T3 are turned on and the source voltage Vcc as a voltage of "H" level is applied to the first cell plate line CP1. Then, the ground voltage Vss is applied to the first electrodes of the ferroelectric capacitors C1 and C3 and the source voltage Vcc is applied to the second electrodes of the ferroelectric capacitors C1 and C3. Likewise, the transistors T6 and T8 are turned on and the source voltage Vcc as a voltage of "H" level is applied to the second reference cell plate line RCP2. Then, the ground voltage Vss is applied to the first electrodes of the ferroelectric capacitors C6 and C8 and the source voltage Vcc is applied to the second electrodes of the ferroelectric capacitors C6 and C8. Each of the ferroelectric capacitors C1, C3, C6 and C8 then changes in the condition from the state in which no voltage is applied to the state in which a negative voltage (−Vcc) is applied thereto.

By this change, in the first memory cell 11, the polarization charge of the ferroelectric capacitor C1 moves from the point C to the point E along the curve 31. In the third memory cell 13, the polarization charge of the ferroelectric capacitor C3 moves from the point D to the point H along the curve 32. At this timing, the second switch circuit 24 is under suspension, so that the second and fourth bit lines BL2 and BL4 have the same bit line capacitance as the first bit line BL1. Thus, in the second reference cell 16 retaining "1" data, the polarization charge of the ferroelectric capacitor C6 moves from the point C to the point E, and in the fourth reference cell 18, the polarization charge of the ferroelectric capacitor C8 moves from the point D to the point H.

At this timing, a charge Q3 is read out on the first and second bit lines BL1 and BL2, and the first and second bit lines BL1 and BL2 have a potential of "1" data corresponding to the point E. Also, a charge Q1 is read out on the third and fourth bit lines BL3 and BL4, and the third and fourth bit lines BL3 and BL4 have a potential of "0" data corresponding to the point H.

Next, at the timing of the time t3 in FIG. 8, the first cell plate line CP1 and the second reference cell plate line RCP2 are inactivated, so that in the first memory cell 11, the third memory cell 13, the second reference cell 16, and the fourth reference cell 18, the voltages applied to the respective ferroelectric capacitors change from the negative voltage (−Vcc) to zero volts.

By this change, in the first memory cell 11, the polarization charge of the ferroelectric capacitor C1 moves from the point E to the point K along the curve 35. In the third memory cell 13, the polarization charge of the ferroelectric capacitor C3 moves from the point H to the point D along the curve 32.

Likewise, in the second reference cell 16, the polarization charge of the ferroelectric capacitor C6 moves from the point E to the point K along the curve 36. In the fourth reference cell 18, the polarization charge of the ferroelectric capacitor C8 moves from the point H to the point D along the curve 32.

The second switch control signal REQ2 is activated prior to the timing of the time t4 shown in FIG. 8. In response, the second switch circuit 24 is driven to equalize the second and fourth bit lines BL2 and BL4. As a result, the second and fourth bit lines BL2 and BL4 have an intermediate potential between the potential of "1" data corresponding to the point E and the potential of "0" data corresponding to the point H.

Next, at the timing of the time t4 in FIG. 8, the potential difference is amplified by the first sense amplifier 26, whereby the first bit line BL1 has the source voltage Vcc and the second bit line BL2 has the ground voltage Vss. Thus, the first electrode of the ferroelectric capacitor C1 of the first memory cell 11 has the source voltage Vcc applied. Therefore, the polarization charge of the ferroelectric capacitor C1 moves from the point K to the point A along the curve 35. The ferroelectric capacitor C6 of the second reference cell 16 is separated from the second bit line BL2, so that the polarization charge thereof does not move and remains at the point K.

Likewise, the potential difference is amplified by the second sense amplifier 28, whereby the third bit line BL3 has the ground voltage Vss and the fourth bit line BL4 has the source voltage Vcc. Thus, the ferroelectric capacitor C3 of the third memory cell 13 keeps a voltage of zero volts, and the polarization charge thereof does not move and remains at the point D. The ferroelectric capacitor C8 of the fourth reference cell 18 is separated from the fourth bit line BL4, so that the polarization charge thereof does not move and remains at the point D.

The reset data signal RPD and the second reset control signal RPG2 are then successively activated, whereby the source voltage Vcc derived from the reset data signal RPD is applied to the first electrode of the ferroelectric capacitor C6 of the second reference cell 16. In the fourth reference cell 18, the ground voltage Vss is applied to the first electrode of the ferroelectric capacitor C8 thereof. Therefore, the voltage applied to the ferroelectric capacitor C6 is then changed from zero volts to a positive voltage, so that the polarization charge thereof moves from the point K to the point A along the curve 35. On the other hand, the ferroelectric capacitor C8 keeps a voltage of zero volts, so that the polarization charge thereof does not move and remains at the point D.

Thereafter, the reset data signal RPD and the second reset control signal RPG2 are successively inactivated subsequently to the timing of the time t5 in FIG. 8, so that the voltages of the first electrodes of the ferroelectric capacitors C6 and C8 become zero volts. Also, the second reference cell plate line RCP2 is inactivated, so that the voltages of the second electrodes of the ferroelectric capacitors C6 and C8 become zero volts. From these actions, in the second reference cell 16, the voltage applied to the ferroelectric capacitor C6 is then changed from a positive voltage to zero volts and the polarization charge thereof moves from the point A to the point C along the curve 31. In the fourth reference cell 18, the ferroelectric capacitor C8 thereof keeps a voltage of zero volts and the polarization charge thereof remains at the point D.

As is apparent from the above, in the read operation in the ferroelectric memory device of the fifth embodiment, the polarization charges of the ferroelectric capacitors of the memory cells and the reference cells move along the same path during the read operation. To be more specific, in a memory cell and a reference cell both of which retain "1" data, the polarization charges of the ferroelectric capacitors move progressively in the order of the point C, the point E, the point K, the point A, and the point C. In a memory cell and a reference cell both of which retain "0" data, the polarization charges of the ferroelectric capacitors move progressively in the order of the point D, the point H, the point B, and the point D. Accordingly, in the read operation of the ferroelectric memory device of the fifth embodiment, the amount of charge for polarization reversal is equal to the charge amount QSW2 between the point C and the point E shown in FIG. 3, which is smaller than that of the first embodiment.

As described above, the ferroelectric memory device of the fifth embodiment makes the amount of charge for polarization reversal smaller than that of the first embodiment. As a result, the characteristics of the number of rewriting operations can be enhanced further in the ferroelectric memory device.

Moreover, since the reference cells supply "1" data and "0" data to the respective bit lines before the switch control signal is activated, the bit lines are equalized with the capacitances of the ferroelectric capacitors not added to the bit lines. As a result, a reference potential can be generated accurately in the ferroelectric memory device.

What is claimed is:

1. A ferroelectric memory device comprising:
   a plurality of bit line pairs each of which is composed of first and second bit lines;
   a plurality of sense amplifiers each for amplifying a potential difference across the corresponding bit line pair;
   a plurality of memory cells provided for the bit line pairs, respectively, each of the memory cells being composed of a first ferroelectric capacitor for retaining data and a transistor whose source is connected to a first electrode of the first ferroelectric capacitor and whose drain is connected to the first bit line;
   a plurality of reference cells provided for the bit line pairs, respectively, each of the reference cells being composed of a second ferroelectric capacitor for retaining data and a transistor whose source is connected to a first electrode of the second ferroelectric capacitor and whose drain is connected to the second bit line;
   a word line connecting sates of the transistors of the memory cells;
   a reference word line connecting gates of the transistors of the reference cells;

a cell plate line connecting second electrodes of the ferroelectric capacitors of the memory cells;

a reference cell plate line connecting second electrodes of the ferroelectric capacitors of the reference cells;

a control circuit for controlling operations of the memory cells, the reference cells, and the sense amplifiers; and a switch circuit connecting the second bit lines included in adjacent bit line pairs of the plurality of bit line pairs, wherein the control circuit inactivates the reference word line during the drive of the sense amplifiers, wherein the control circuit stops the drive of the switch circuit during the drive of the sense amplifiers, and wherein the control circuit performs successive actions of:

driving the switch circuit and activating the word line, the cell plate line, the reference word line and the reference cell plate line;

inactivating the cell plate line and the reference cell plate line;

inactivating the reference word line;

stopping the drive of the switch circuit; and driving the sense amplifiers.

2. A ferroelectric memory device comprising:

a plurality of bit line pairs each of which is composed of first and second bit lines;

a plurality of sense amplifiers each for amplifying a potential difference across the corresponding bit line pair;

a plurality of memory cells provided for the bit line pairs, respectively, each of the memory cells being composed of a first ferroelectric capacitor for retaining data and a transistor whose source is connected to a first electrode of the first ferroelectric capacitor and whose drain is connected to the first bit line;

a plurality of reference cells provided for the bit line pairs, respectively, each of the reference cells being composed of a second ferroelectric capacitor for retaining data and a transistor whose source is connected to a first electrode of the second ferroelectric capacitor and whose drain is connected to the second bit line;

a word line connecting gates of the transistors of the memory cells;

a reference word line connecting gates of the transistors of the reference cells;

a cell plate line connecting second electrodes of the ferroelectric capacitors of the memory cells;

a reference cell plate line connecting second electrodes of the ferroelectric capacitors of the reference cells;

a control circuit for controlling operations of the memory cells, the reference cells, and the sense amplifiers; and a switch circuit connecting the second bit lines included in adjacent bit line pairs of the plurality of bit line pairs, wherein the control circuit inactivates the reference word line during the drive of the sense amplifiers, wherein the control circuit stops the drive of the switch circuit during the drive of the sense amplifiers, and wherein the control circuit performs successive actions of:

driving the switch circuit and activating the word line, the cell plate line, the reference word line and the reference cell plate line;

inactivating the cell plate line and the reference cell plate line;

stopping the drive of the switch circuit;

inactivating the reference word line; and driving the sense amplifiers.

3. A ferroelectric memory device comprising:

a plurality of bit line pairs each of which is composed of first and second bit lines;

a plurality of sense amplifiers each for amplifying a potential difference across the corresponding bit line pair;

a plurality of memory cells provided for the bit line pairs, respectively, each of the memory cells being composed of a first ferroelectric capacitor for retaining data and a transistor whose source is connected to a first electrode of the first ferroelectric capacitor and whose drain is connected to the first bit line;

a plurality of reference cells provided for the bit line pairs, respectively, each of the reference cells being composed of a second ferroelectric capacitor for retaining data and a transistor whose source is connected to a first electrode of the second ferroelectric capacitor and whose drain is connected to the second bit line;

a word line connecting gates of the transistors of the memory cells;

a reference word line connecting gates of the transistors of the reference cells;

a cell plate line connecting second electrodes of the ferroelectric capacitors of the memory cells;

a reference cell plate line connecting second electrodes of the ferroelectric capacitors of the reference cells;

a control circuit for controlling operations of the memory cells, the reference cells, and the sense amplifiers; and a switch circuit connecting the second bit lines included in adjacent bit line pairs of the plurality of bit line pairs, wherein the control circuit inactivates the reference word line during the drive of the sense amplifiers, wherein the control circuit stops the drive of the switch circuit during the drive of the sense amplifiers, and wherein the control circuit performs successive actions of:

driving the switch circuit and activating the word line, the cell plate line, the reference word line and the reference cell plate line;

inactivating the reference word line;

stopping the drive of the switch circuit;

inactivating the cell plate line and the reference cell plate line; and driving the sense amplifiers.

4. A ferroelectric memory device comprising:

a plurality of bit line pairs each of which is composed of first and second bit lines;

a plurality of sense amplifiers each for amplifying a potential difference across the corresponding bit line pair;

a plurality of memory cells provided for the bit line pairs, respectively, each of the memory cells being composed of a first ferroelectric capacitor for retaining data and a transistor whose source is connected to a first electrode of the first ferroelectric capacitor and whose drain is connected to the first bit line;

a plurality of reference cells provided for the bit line pairs, respectively, each of the reference cells being composed of a second ferroelectric capacitor for retaining data and a transistor whose source is connected to a first electrode of the second ferroelectric capacitor and whose drain is connected to the second bit line;

a word line connecting gates of the transistors of the memory cells;

a reference word line connecting gates of the transistors of the reference cells;

a cell plate line connecting second electrodes of the ferroelectric capacitors of the memory cells;

a reference cell plate line connecting second electrodes of the ferroelectric capacitors of the reference cells;

a control circuit for controlling operations of the memory cells, the reference cells, and the sense amplifiers; and a switch circuit connecting the second bit lines included in adjacent bit line pairs of the plurality of bit line pairs, wherein the control circuit inactivates the reference word line during the drive of the sense amplifiers, wherein the control circuit stops the drive of the switch circuit during the drive of the sense amplifiers, and wherein the control circuit performs successive actions of:

driving the switch circuit and activating the word line, the cell plate line, the reference word line and the reference cell plate line;

stopping the drive of the switch circuit;

inactivating the reference word line;

inactivating the cell plate line and the reference cell plate line; and driving the sense amplifiers.

5. A method for reading data from a ferroelectric memory device, wherein the ferroelectric memory device includes:

a plurality of bit line pairs each of which is composed of first and second bit lines;

a plurality of sense amplifiers each for amplifying a potential difference across the corresponding bit line pair;

a plurality of memory cells provided for the bit line pairs, respectively, each of the memory cells being composed of a first ferroelectric capacitor for retaining data and a transistor whose source is connected to a first electrode of the first ferroelectric capacitor and whose drain is connected to the first bit line;

a plurality of reference cells provided for the bit line pairs, respectively, each of the reference cells being composed of a second ferroelectric capacitor for retaining data and a transistor whose source is connected to a first electrode of the second ferroelectric capacitor and whose drain is connected to the second bit line;

a word line connecting gates of the transistors of the memory cells;

a reference word line connecting gates of the transistors of the reference cells;

a cell plate line connecting second electrodes of the ferroelectric capacitors of the memory cells;

a reference cell plate line connecting second electrodes of the ferroelectric capacitors of the reference cells;

a control circuit for controlling operations of the memory cells, the reference cells, and the sense amplifiers; and a switch circuit connecting the second bit lines included in adjacent bit line pairs of the plurality of bit line pairs;

the method comprising:

a first step of activating the word line and the reference word line;

a second step of activating the cell plate line and the reference cell plate line for a predetermined period of time;

a third step of activating a switch control signal for driving the switch circuit;

a fourth step of inactivating the reference word line after the first step;

a fifth step of inactivating the switch control signal after the third step; and a sixth step of driving the sense amplifier for a predetermined period of time after the fourth step, wherein the second step is kept on until after the initiation of the sixth step.

* * * * *